(12) United States Patent
Horiguchi

(10) Patent No.: US 11,404,953 B2
(45) Date of Patent: Aug. 2, 2022

(54) DRIVE CIRCUIT FOR POWER SEMICONDUCTOR ELEMENT AND POWER SEMICONDUCTOR MODULE EMPLOYING THE SAME

(71) Applicant: Mitsubishi Electric Corporation, Tokyo (JP)

(72) Inventor: Takeshi Horiguchi, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 17/290,996

(22) PCT Filed: Dec. 11, 2018

(86) PCT No.: PCT/JP2018/045559
§ 371 (c)(1),
(2) Date: May 4, 2021

(87) PCT Pub. No.: WO2020/121419
PCT Pub. Date: Jun. 18, 2020

(65) Prior Publication Data
US 2022/0045596 A1    Feb. 10, 2022

(51) Int. Cl.
*H03K 17/10*    (2006.01)
*H02M 1/08*    (2006.01)
*H02M 1/00*    (2006.01)
*H03K 17/082*    (2006.01)
*H02M 7/5387*    (2007.01)
(Continued)

(52) U.S. Cl.
CPC ............ *H02M 1/08* (2013.01); *H02M 1/0009* (2021.05); *H02M 1/0012* (2021.05); *H03K 17/0828* (2013.01); *H02M 7/53871* (2013.01); *H02P 27/08* (2013.01); *H03K 2017/0806* (2013.01)

(58) Field of Classification Search
CPC combination set(s) only.
See application file for complete search history.

(56) References Cited

U.S. PATENT DOCUMENTS 7,710,187 B2 *    5/2010    Hiyama ................. H03K 17/74
                                                     327/434
9,954,521 B2 *    4/2018    Takizawa ......... H03K 17/08122

FOREIGN PATENT DOCUMENTS

| JP | 10-32976 A | 2/1998 |
| JP | 2001-197724 A | 7/2001 |
| JP | 2002-95239 A | 3/2002 |

OTHER PUBLICATIONS

International Search Report and Written Opinion dated Feb. 26, 2019, received for PCT Application PCT/JP2018/045559, Filed on Dec. 11, 2018, 9 pages including English Translation.

* cited by examiner

*Primary Examiner* — Long Nguyen
(74) *Attorney, Agent, or Firm* — Xsensus LLP

(57) ABSTRACT

A drive circuit drives a power semiconductor element including a control terminal, a first main electrode, and a second main electrode. The drive circuit includes a first switching-off circuit and a second switching-off circuit each for turning off the power semiconductor element. The second switching-off circuit is lower in impedance than the first switching-off circuit. In a case where the power semiconductor element is turned off, only the first switching-off circuit operates when the power semiconductor element is in an unusual state, and the first switching-off circuit and the second switching-off circuit complementarily operate when the power semiconductor element is in a normal state.

15 Claims, 16 Drawing Sheets

(51) Int. Cl.
*H02P 27/08* (2006.01)
*H03K 17/08* (2006.01)

DRIVE CIRCUIT FOR POWER SEMICONDUCTOR ELEMENT AND POWER SEMICONDUCTOR MODULE EMPLOYING THE SAME

CROSS-REFERENCE TO RELATED APPLICATION

The present application is based on PCT filing PCT/JP2018/045559, filed Dec. 11, 2018, the entire contents of which are incorporated herein by reference.

TECHNICAL FIELD

The present disclosure relates to a drive circuit for a power semiconductor element, and a power semiconductor module employing the same.

BACKGROUND ART

In order to achieve compact and high-efficiency power converter, a method of reducing a power loss in a power semiconductor element has been known. Such a power loss in the power semiconductor element includes a switching energy loss at the transition of the switching operation and a conduction loss occurring in the conducting state. The conduction loss depends on the characteristics of the power semiconductor element, whereas the switching energy loss can be reduced by a method of driving a power semiconductor element.

The switching energy loss can be classified into a turn-on loss in a turn-on operation and a turn-off loss in a turn-off operation. For example, in the turn-off operation, a drive circuit for a power semiconductor element disclosed in PTL 1 turns a first switch SW to a negative gate voltage Voff side and simultaneously turns on a second switch SW2. By turning on second switch SW2, a negative gate voltage is applied to a control terminal without passing through a gate resistor Rg, to thereby turn off the power semiconductor element. When the collector-emitter voltage becomes equal to or higher than an arbitrarily set value, second switch SW2 is turned off by the output from the comparing means (COM), to thereby apply a negative voltage to the control terminal through a gate resistor. This drive circuit can shorten the time period required until the collector-emitter voltage reaches a prescribed value, so that a turn-off loss can be reduced.

The drive circuit for a power semiconductor element disclosed in PTL 1 turns on second switch SW2 upon start of the turn-off operation of the power semiconductor element, so as to allow the turn-off operation at high speed. This can shorten the switching time period, with the result that the turn-off loss can be reduced.

CITATION LIST

Patent Literature

PTL 1: Japanese Patent Laying-Open No. 2002-95239 (paragraphs 0031 to 0033, FIG. 1)

SUMMARY OF INVENTION

Technical Problem

However, in the drive circuit for a power semiconductor element disclosed in PTL 1, a collector-emitter voltage Vce rises in accordance with the turn-off operation of the power semiconductor element. Since collector-emitter voltage Vce rises sharply, the rate of change in voltage (dVce/dt) rises, thereby increasing an electromagnetic noise.

In the drive circuit for a power semiconductor element disclosed in PTL 1, also in the case where the power semiconductor element is turned off in order to protect the power semiconductor element when an overcurrent flows through the power semiconductor element or when an unusual state such as a short-circuit operation occurs in the power semiconductor element, the power semiconductor element performs a turn-off operation at high speed in the same manner as in the normal state. As a result, an electromagnetic noise increases and a surge voltage rises.

Thus, the present invention aims to provide a drive circuit for a power semiconductor element, by which a turn-off loss can be reduced when the power semiconductor element is in a normal state, and by which an electromagnetic noise can be reduced and a surge voltage can be suppressed when the power semiconductor element is in an unusual state, and also aims to provide a power semiconductor module employing the drive circuit.

Solution to Problem

The present invention provides a drive circuit for driving a power semiconductor element including a control terminal, a first main electrode, and a second main electrode. The drive circuit includes a first switching-off circuit and a second switching-off circuit each to turn off the power semiconductor element. An impedance of the second switching-off circuit is lower than that of the first switching-off circuit. In a case where the power semiconductor element is turned off, only the first switching-off circuit operates when the power semiconductor element is in an unusual state, and the first switching-off circuit and the second switching-off circuit complementarily operate when the power semiconductor element is in a normal state.

Advantageous Effects of Invention

According to the present invention, a turn-off loss can be reduced when the power semiconductor element is in a normal state, and also, an electromagnetic noise can be reduced and a surge voltage can be suppressed when the power semiconductor element is in an unusual state.

DESCRIPTION OF EMBODIMENTS

In the following, embodiments will be described with reference to the accompanying drawings.

First Embodiment

Figure 1:
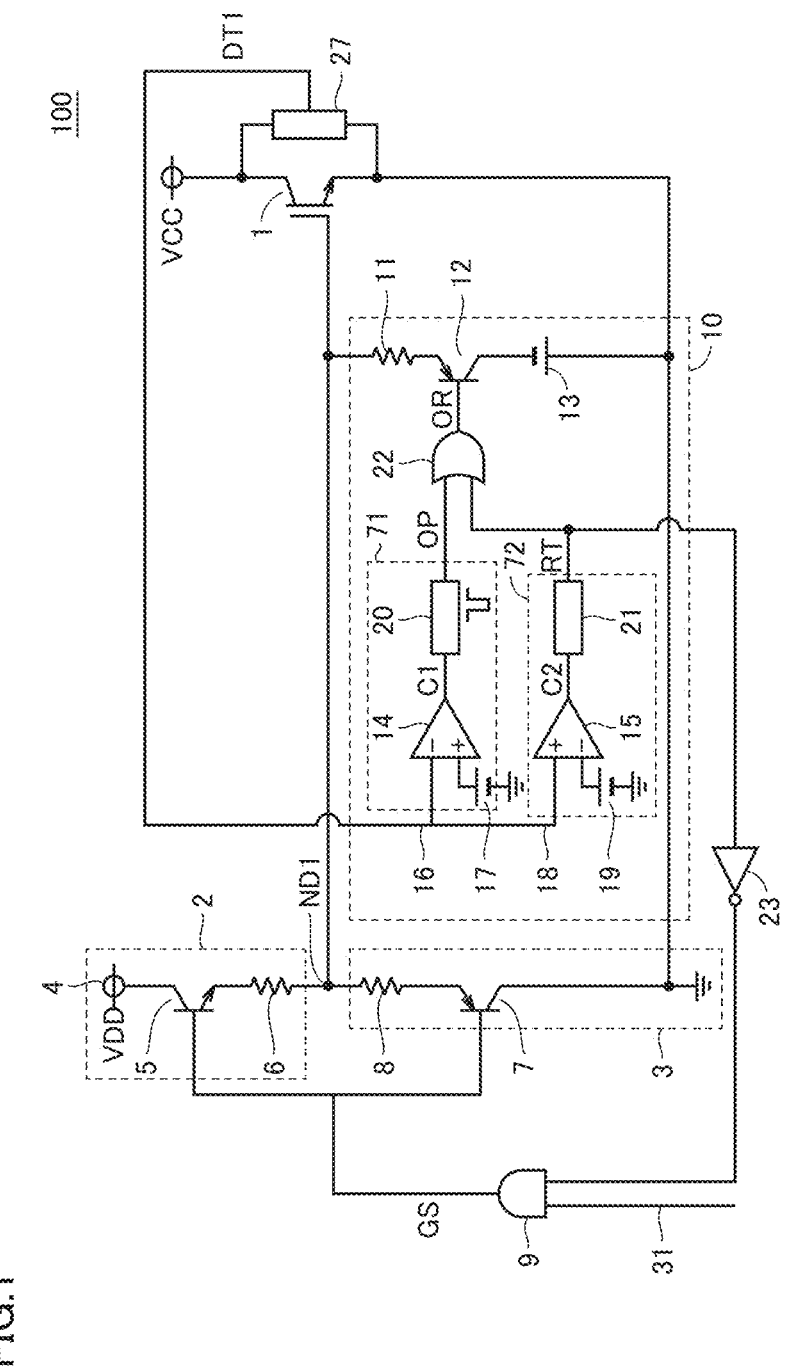
FIG. 1 is a diagram showing a configuration example of a drive circuit 100 for a power semiconductor element according to the first embodiment.

FIG. 1 is a diagram showing a configuration example of a drive circuit 100 for a power semiconductor element according to the first embodiment.

Drive circuit 100 drives a power semiconductor element 1.

Power semiconductor element 1 is arranged between a power supply VCC and a reference potential (GND). Power semiconductor element 1 has a control terminal connected to a node ND1. In the following description, the control terminal may also be referred to as a gate. The collector terminal and the emitter terminal may also be referred to as the first main electrode and the second main electrode, respectively.

Drive circuit 100 includes: a switching-on circuit 2 for turning on power semiconductor element 1; a first switching-off circuit 3 and a second switching-off circuit 10 each for turning off power semiconductor element 1; a gate operating command circuit 9, an inverting circuit 23, and an interterminal voltage detector 27.

Interterminal voltage detector 27 detects a voltage Vce between the first main electrode (a collector terminal) and the second main electrode (an emitter terminal) of power semiconductor element 1 (voltage Vce will be hereinafter referred to as an interterminal voltage), and outputs a detection signal DT1 having a value showing the magnitude of interterminal voltage Vce. In the following description, inter main electrode interterminal voltage Vce may also be referred to as a collector-emitter voltage. A gate-emitter voltage Vge of power semiconductor element 1 may also be referred to as a gate voltage. A collector current Ic may also be referred to as a collector current.

Switching-on circuit 2 turns on power semiconductor element 1. Switching-on circuit 2 includes a turning-on switch 5, a turning-on gate resistor 6, and a voltage source 4. Turning-on switch 5 has a first end connected to voltage source 4. Turning-on switch 5 has a second end connected to a first end of turning-on gate resistor 6. Turning-on gate resistor 6 has a second end connected to node ND1.

First switching-off circuit 3 turns off power semiconductor element 1. First switching-off circuit 3 includes a first turning-off switch 7 and a first turning-off gate resistor 8.

First turning-off gate resistor 8 has a first end connected to node ND1. First turning-off gate resistor 8 has a second end connected to a first end of first turning-off switch 7. First turning-off switch 7 has a second end connected to a reference potential (GND).

Second switching-off circuit 10 turns off power semiconductor element 1. Second switching-off circuit 10 includes an operating time period setting unit 71, an unusual state detection unit 72, a logical operation circuit 22, a second turning-off switch 12, a second turning-off gate resistor 11, and a voltage source 13.

Second turning-off gate resistor 11 has a first end connected to node ND1 and a second end connected to a first end of second turning-off switch 12. Second turning-off switch 12 has a second end connected to a first end of voltage source 13. Voltage source 13 has a second end connected to a reference potential (GND). The electric potential of the first end of voltage source 13 is lower than that of the second end of voltage source 13. For example, second turning-off switch 12 can be configured of a PNP transistor.

Operating time period setting unit 71 sets a time period during which second switching-off circuit 10 operates. Operating time period setting unit 71 includes a comparator 14 and a one-shot pulse circuit 20. Comparator 14 compares an operating time period setting signal 16 with a reference voltage 17. Comparator 14 outputs a low-level signal when operating time period setting signal 16 is higher than reference voltage 17. Comparator 14 outputs a high-level signal when operating time period setting signal 16 is lower than reference voltage 17. One-shot pulse circuit 20 receives an output signal C1 from comparator 14 and outputs a pulse signal having a certain time width.

In the present embodiment, operating time period setting signal 16 is defined as detection signal DT1 output from interterminal voltage detector 27. Reference voltage 17 is higher than a first voltage V1 determined in advance and lower than a second voltage V2 determined in advance. First voltage V1 is an interterminal voltage appearing when power semiconductor element 1 is in a conducting state, i.e., an ON voltage. Second voltage V2 is an interterminal voltage Vce (=VCC) of power semiconductor element 1 that appears when power semiconductor element 1 is in a off state.

Unusual state detection unit 72 detects an unusual state of power semiconductor element 1. Unusual state detection unit 72 includes a comparator 15 and a latch circuit 21. Comparator 15 receives an unusual state detection signal 18 and a reference voltage 19. Comparator 15 outputs a high-level signal when unusual state detection signal 18 is higher than reference voltage 19. Comparator 15 outputs a low-level signal when unusual state detection signal 18 is lower than reference voltage 19. Latch circuit 21 holds an output signal C2 from comparator 15.

In the present embodiment, the short-circuit state is defined as an unusual state, and unusual state detection signal 18 is defined as detection signal DT1 output from interterminal voltage detector 27. Unusual state detection unit 72 detects whether power semiconductor element 1 is in a short-circuit state or not. Reference voltage 19 has a predetermined magnitude. When power semiconductor element 1 is in a short-circuit state, unusual state detection signal 18 is higher than reference voltage 19.

Logical operation circuit 22 performs a logical operation of the output from operating time period setting unit 71 and the output from unusual state detection unit 72. The output from logical operation circuit 22 is connected to the control terminal of second turning-off switch 12. The operation of second turning-off switch 12 is controlled by an output signal OR from logical operation circuit 22. Specifically, logical operation circuit 22 performs a logical sum (OR) of an output signal OP from one-shot pulse circuit 20 and an output signal RT from latch circuit 21.

Inverting circuit 23 inverts output signal RT from latch circuit 21.

Gate operating command circuit 9 performs a logical operation of the output signal from inverting circuit 23 and a gate command 31. Gate operating command circuit 9 is configured of an AND circuit. An output signal GS from gate operating command circuit 9 is input to the control terminal of turning-on switch 5 and the control terminal of first turning-off switch 7. Turning-on switch 5 and first turning-off switch 7 complementarily operate. For example, as shown in FIG. 1, turning-on switch 5 is configured of an NPN transistor, and first turning-off switch 7 is configured of a PNP transistor.

When gate command 31 is at a high level at which it indicates a turn-on operation and when unusual state detection signal 18 is lower than reference voltage 19 (in a normal state), output signal GS from the gate operating command circuit shifts to a high level. When output signal GS from gate operating command circuit 9 is at a high level, turning-on switch 5 is turned on and first turning-off switch 7 is turned off.

When gate command 31 is at a low level at which it indicates a turn-off operation, or when unusual state detection signal 18 is higher than reference voltage 19 (in an unusual state), output signal GS from the gate operating command circuit shifts to a low level. When output signal GS from gate operating command circuit 9 is at a low level, turning-on switch 5 is turned off and first turning-off switch 7 is turned on.

The impedance of second switching-off circuit 10 is set to be lower than that of first switching-off circuit 3.

In the turn-off operation of power semiconductor element 1, the electric potential of the control terminal of power semiconductor element 1 is defined as Vg. While the ON resistance value of first turning-off switch 7 is ignored, the resistance value of first turning-off gate resistor 8 is defined as Rg8. While the ON resistance value of second turning-off switch 12 is ignored, the resistance value of second turning-off gate resistor 11 is defined as Rg11, and the power supply voltage of voltage source 13 is defined as V13 (<0).

First switching-off circuit 3 extracts the gate charge of power semiconductor element 1 at a maximum of Vg/Rg8, thereby turning off power semiconductor element 1. On the other hand, second switching-off circuit 10 extracts the electric charge of power semiconductor element 1 at a maximum of (Vg−V13)/Rg11, thereby turning off power semiconductor element 1.

Thus, by setting power supply voltage V13 of voltage source 13, resistance value Rg8 of first turning-off gate resistor 8, and resistance value Rg11 of the second turning-off gate resistor such that Vg/Rg8<(Vg V13)/Rg11, that of second switching-off circuit 10 can be set to be lower than the impedance of first switching-off circuit 3. In particular, Rg11<Rg8 is most effective.

Further, in order to reduce the turn-off loss, it is effective to shorten the time period during which interterminal voltage Vce of power semiconductor element 1 rises during the turn-off operation.

The following describes the operation of drive circuit 100 that is performed in the turn-off operation.

In the operation of turning off power semiconductor element 1, first switching-off circuit 3 operates when power semiconductor element 1 is in an unusual state, and first switching-off circuit 3 and second switching-off circuit 10 complementarily operate when power semiconductor element 1 is in a normal state. More specifically, when power semiconductor element 1 is in a normal state in the operation of turning off power semiconductor element 1, first switching-off circuit 3, second switching-off circuit 10, and first switching-off circuit 3 operate in this order, which will be hereinafter more specifically described.

When gate command 31 shifts to a low level at which it indicates a turn-off operation, output signal GS from gate operating command circuit 9 shifts to a low level. As a result, turning-on switch 5 is turned off and first turning-off switch 7 is turned on.

When the operating time period setting signal (=the interterminal voltage of power semiconductor element 1) becomes higher than reference voltage 17, output signal C1 from comparator 14 shifts to a low level. Thereby, one-shot pulse circuit 20 outputs pulse signal OP, which is kept at a low level for a prescribed time period, to one input terminal of logical operation circuit 22.

When power semiconductor element 1 operates in an unusual state, unusual state detection signal 18 (=the interterminal voltage of power semiconductor element 1) becomes higher than reference voltage 19. In this case, output signal C2 from comparator 15 shifts to a high level. When power semiconductor element 1 is in a normal state, unusual state detection signal 18 (=the interterminal voltage of power semiconductor element 1) becomes lower than reference voltage 19. In this case, output signal C2 from comparator 15 shifts to a low level. Output signal C2 from comparator 15 is sent through latch circuit 21 to the other input terminal of logical operation circuit 22 and also to inverting circuit 23.

When output signal OR from logical operation circuit 22 is at a low level, second turning-off switch 12 is turned on. As a result, second turning-off switch 12 brings about a conducting state among the control terminal of power semiconductor element 1, second turning-off gate resistor 11, second turning-off switch 12, and voltage source 13. In this case, the impedance of the second switching-off circuit 10 is set to be lower in than that of first switching-off circuit 3. Thus, when second turning-off switch 12 is turned on, power semiconductor element 1 performs a turn-off operation by second switching-off circuit 10.

When output signal OR from logical operation circuit 22 is at a high level, second turning-off switch 12 is turned off. This results in a blocking state among the control terminal of power semiconductor element 1, second turning-off gate resistor 11, second turning-off switch 12, and voltage source 13.

When power semiconductor element 1 is in a normal state, output signal C2 from comparator 15 shifts to a low level. Accordingly, output signal OR from logical operation circuit 22 shifts to a low level only during a time period set by one-shot pulse circuit 20 since operating time period setting signal 16 becomes higher than reference voltage 17. Except for this time period, output signal OR from logical operation circuit 22 is at a high level. In a time period during which output signal OR from logical operation circuit 22 is at a low level, second turning-off switch 12 is in an ON state. In a time period during which second turning-off switch 12 is in an ON state, power semiconductor element 1 performs a turn-off operation by second switching-off circuit 10. In a time period during which output signal OR from logical operation circuit 22 is at a high level, second turning-off switch 12 is in an OFF state. In a time period during which second turning-off switch 12 is in an OFF state, power semiconductor element 1 performs a turn-off operation by first switching-off circuit 3.

On the other hand, when power semiconductor element 1 is in an unusual state, output signal C2 from comparator 15 shifts to a high level. Thus, output signal OR from logical operation circuit 22 is at a high level during the turn-off operation of power semiconductor element 1. As a result, second turning-off switch 12 is turned off. Since second turning-off switch 12 is in an OFF state, power semiconductor element 1 performs a turn-off operation by first switching-off circuit 3.

Figure 2:
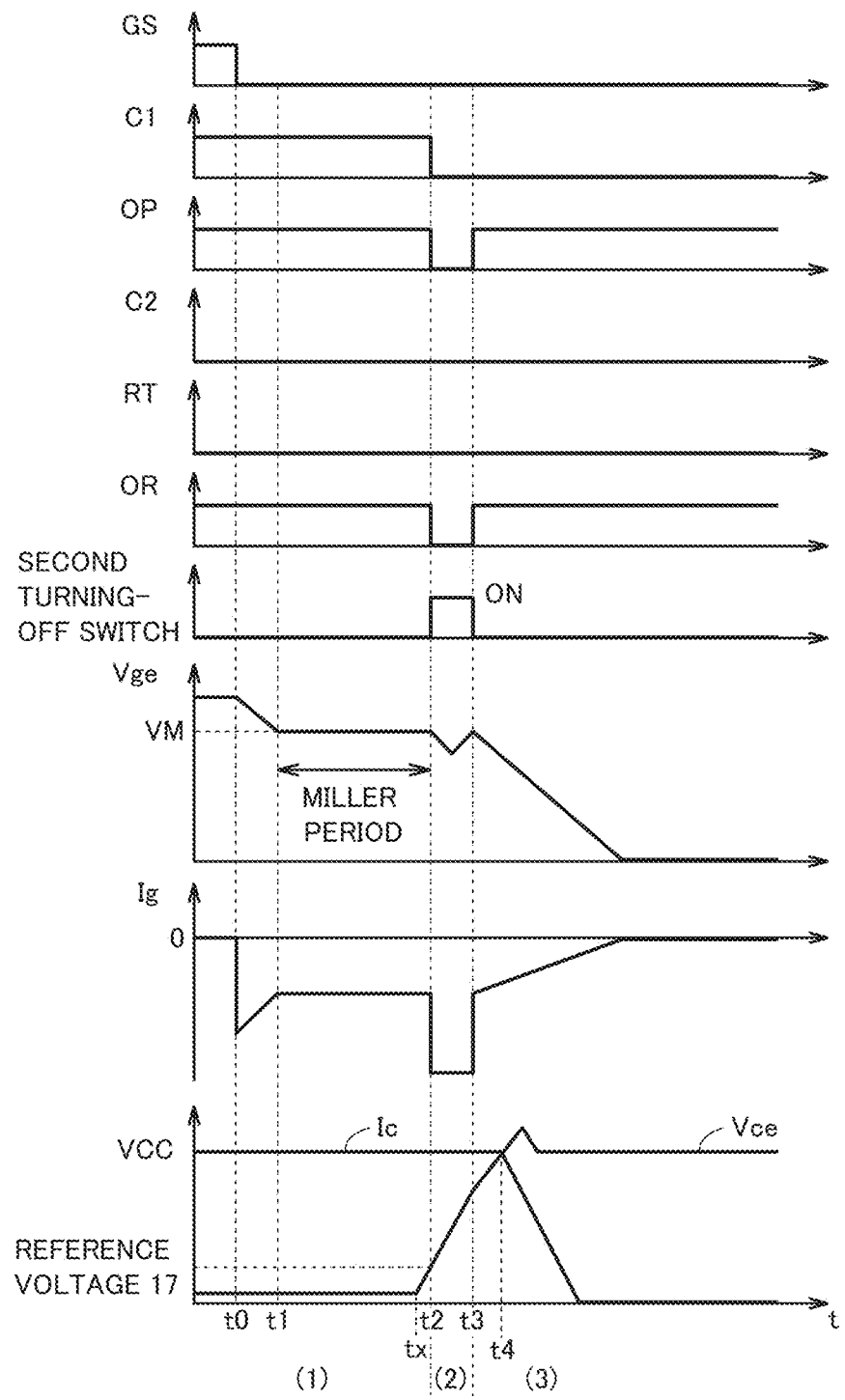
FIG. 2 is a timing chart of a turn-off operation of a power semiconductor element 1 in the first embodiment that is performed when power semiconductor element 1 is in a normal state.

FIG. 2 is a timing chart of the turn-off operation of power semiconductor element 1 in the first embodiment that is performed when power semiconductor element 1 is in a normal state.

At a time point before a time point t0, power semiconductor element 1 is in an ON state, gate-emitter voltage Vge of power semiconductor element 1 is constant, gate current Ig is zero, collector current Ic is constant, and, interterminal voltage Vce is an ON voltage (a voltage appearing when power semiconductor element 1 is ON).

At time point t0, gate command 31 shifts to a low level at which it indicates a turn-off operation, so that output signal GS from gate operating command circuit 9 shifts to a low level. Thereby, turning-on switch 5 is turned off and first turning-off switch 7 is turned on.

From time point t0 to a time point t2, interterminal voltage Vce of power semiconductor element 1 is lower than reference voltage 17, and thus, output signal C1 from comparator 14 is maintained at a high level. Accordingly, output signal OP from one-shot pulse circuit 20 is maintained at a high level. When power semiconductor element 1 is in a normal state, output signal C2 from comparator 15 is at a low level, so that output signal RT from latch circuit 21 is always at a low level during the turn-off operation. Since output signal OR from logical operation circuit 22 is a logical sum (OR) of: output signal OP from one-shot pulse circuit 20; and output signal RT from latch circuit 21, this output signal OR is maintained at a high level. Since output signal OR from logical operation circuit 22 is at a high level, second turning-off switch 12 is turned off.

On the other hand, at time point t0, turning-on switch 5 is turned off and first turning-off switch 7 is turned on, and thereby, first switching-off circuit 3 operates. By first switching-off circuit 3, gate-emitter voltage Vge of power semiconductor element 1 starts to decrease from the timing of time point t0. The electric charge accumulated in the gate capacitance of power semiconductor element 1 is extracted. Thus, at time point t0, gate current Ig increases in the negative direction. Then, at and after time point t0, gate-emitter voltage Vge lowers and gate current Ig decreases. From time point t0 to a time point t1, collector current Ic and interterminal voltage Vce do not change.

When gate-emitter voltage Vge reaches a Miller voltage VM (a constant voltage) at time point t1, gate current Ig also becomes constant. At a time point tx in the Miller period from time point t1 to a time point t2, interterminal voltage Vce starts to rise.

At time point t2, voltage Vce between the main electrodes of power semiconductor element 1 rises above reference voltage 17, and thereby, output signal C1 from comparator 14 shifts to a low level. When output signal C1 from comparator 14 shifts to a low level, output signal OP from one-shot pulse circuit 20 appears as a low-level pulse until a time point t3. Output signal C2 from comparator 15 is at a low level when power semiconductor element 1 is in a normal state. Thus, output signal RT from latch circuit 21 is always at a low level during the turn-off operation. Since output signal OR from logical operation circuit 22 is a logical sum (OR) of: output signal OP from one-shot pulse circuit 20 and output signal RT from latch circuit 21, output signal OR from logical operation circuit 22 is kept at a low level for a certain time period in the same manner as with output signal OP from one-shot pulse circuit 20. When output signal OR from logical operation circuit 22 is at a low level, second turning-off switch 12 is in an ON state.

In this way, second switching-off circuit 10 operates when second turning-off switch 12 is in an ON state only during the time period set by one-shot pulse circuit 20 since detection signal DT1 output from interterminal voltage detector 27 of power semiconductor element 1 rises above reference voltage 17. In other words, from time point t2 to time point t3, second switching-off circuit 10 turns off power semiconductor element 1. Since the impedance of first switching-off circuit 3 is higher than that of second switching-off circuit 10, first switching-off circuit 3 does not operate from time point t2 to time point t3.

The feedback capacitance of the power semiconductor element has voltage dependence. Thus, there is a time period during which gate-emitter voltage Vge of power semiconductor element 1 is constant (a Miller period). During this time period, gate current Ig of power semiconductor element 1 is used for discharging of the feedback capacitance of power semiconductor element 1. Then, collector current Ic decreases until interterminal voltage Vce of power semiconductor element 1 reaches a voltage VCC of power supply VCC.

The impedance of second switching-off circuit 10 is set to be lower than that of first switching-off circuit 3. Thus, when second switching-off circuit 10 operates, gate-emitter voltage Vge temporarily decreases and gate current Ig increases in the negative direction. As a result, the voltage change rate of interterminal voltage Vce of power semiconductor element 1 rises. In other words, the gate charge of power semiconductor element 1 can be extracted at high speed as compared with the case where the turn-off operation is performed by first switching-off circuit 3. Thereby, turn-off loss can be reduced.

At and after time point t3, second turning-off switch 12 is in an OFF state, so that first switching-off circuit 3 operates. The turn-off operation is performed by first switching-off circuit 3. Then, gate-emitter voltage Vge of power semiconductor element 1 lowers, gate current Ig decreases, and interterminal voltage Vce rises.

At a time point t4, when interterminal voltage Vce reaches power supply voltage VCC (=a direct-current (DC) link voltage), collector current Ic starts to decrease. Due to the change over time in collector current Ic, the induced voltage represented by Ls×dIc/dt (where Ls represents a parasitic inductance in a main circuit interconnection) is superimposed as a surge voltage on interterminal voltage Vce of power semiconductor element 1.

As described above, when power semiconductor element 1 is in a normal state, first switching-off circuit 3 operates in a time period (1) at and before time point t2, second switching-off circuit 10 operates in a time period (2) from time point t2 to time point t3, and first switching-off circuit 3 operates in a time period (3) at and after time point t3.

The reason for the control as described above will be hereinafter described. In the turn-off operation, interterminal voltage Vce of power semiconductor element 1 rises from the ON voltage to power supply voltage VCC (=a DC link voltage). In order to reduce the turn-off loss in the normal operation, the switching speed of the turn-off operation needs to be raised. However, an induced voltage represented by Ls×dIc/dt is generated in the parasitic inductance of the main circuit interconnection, where Ls represents a parasitic inductance in the main circuit interconnection, and dIc/dt represents the rate of change over time of collector current Ic. Thus, a surge voltage (Ls×dI/dt) is superimposed on the power supply voltage in power semiconductor element 1. In order to suppress the surge voltage, it is necessary to reduce dIc/dt, i.e., to slow the switching speed.

When the turn-off operation is performed at a high switching speed from a voltage level at which interterminal voltage Vce is approximately equal to the ON voltage, the rate of rising change in interterminal voltage Vce (dVce/dt) becomes steep, which may increase electromagnetic noise. On the other hand, in the case where the switching speed is changed at a timing at which interterminal voltage Vce is higher than the DC link voltage (VCC), the timing of occurrence of the surge voltage has already reached, and thus, the switching speed needs to be changed at the latest before the timing at which interterminal voltage Vce of power semiconductor element 1 reaches the DC link voltage (VCC).

In view of the above, in the present embodiment, reference voltage 17 is set to a level higher than the ON voltage of power semiconductor element 1 and lower than the DC link voltage. In this state, after interterminal voltage Vce rises above reference voltage 17, power semiconductor element 1 is turned off by second switching-off circuit 10. Thus, in the normal operation, the speed of the turn-off operation changes in the order of a low speed, a high speed, and a low speed.

Figure 3:
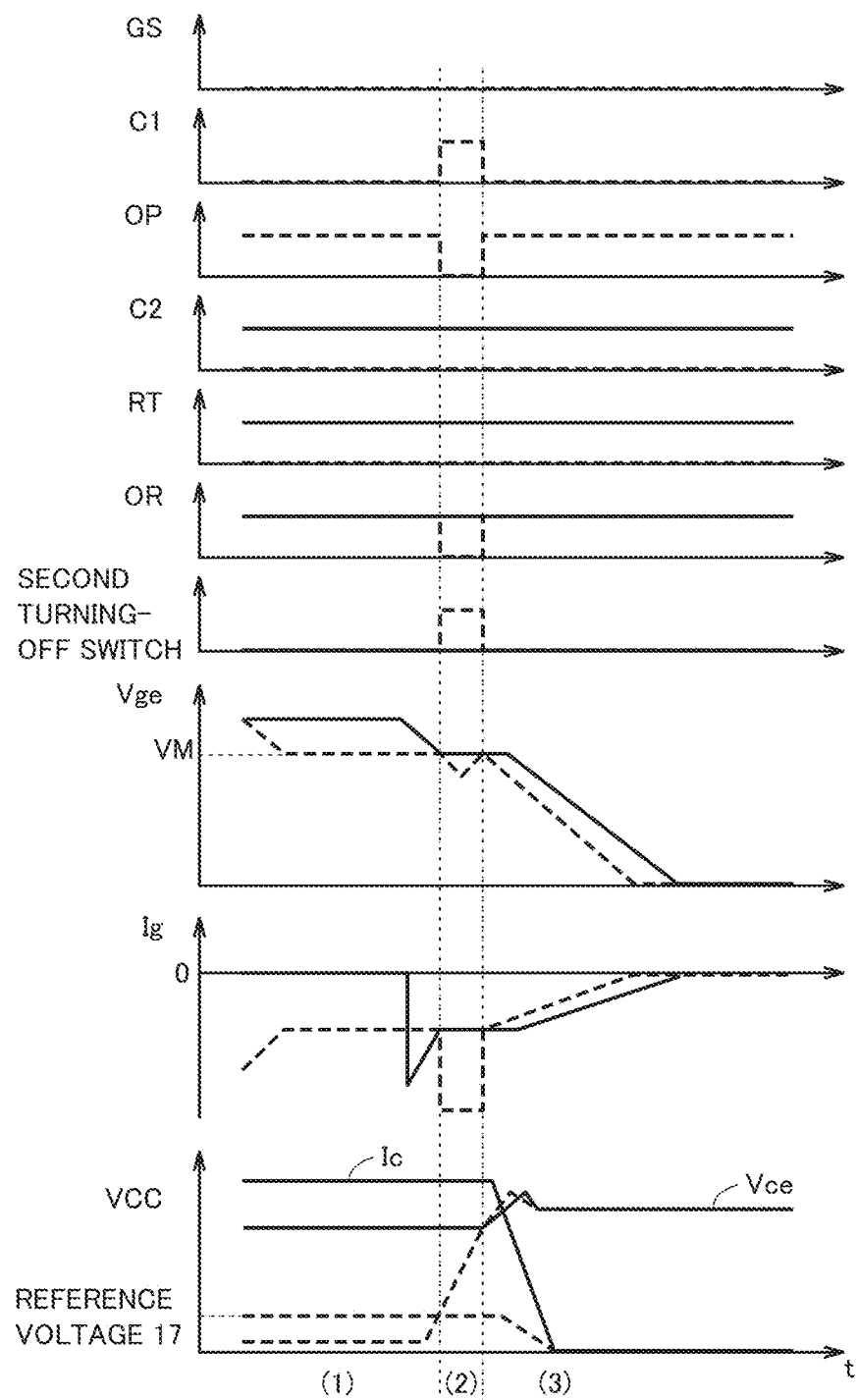
FIG. 3 is a timing chart of the turn-off operation of power semiconductor element 1 in the first embodiment that is performed when power semiconductor element 1 is in an unusual state.

FIG. 3 is a timing chart of the turn-off operation of power semiconductor element 1 in the first embodiment that is performed when power semiconductor element 1 is in an unusual state.

In FIG. 3, the waveform indicated by a dotted line shows a waveform in a normal state, and the waveform indicated by a solid line shows a waveform in an unusual state. In this case, the time point at which the turn-off operation starts is different between the waveform in the normal state and the waveform in the unusual state.

Since output signal OP from one-shot pulse circuit 20 that is one input signal of logical operation circuit 22 is the same as that in the case where power semiconductor element 1 is in a normal state, the description thereof will not be repeated.

When power semiconductor element 1 is in a short-circuit state, interterminal voltage Vce of power semiconductor element 1 is higher than reference voltage 19. As a result, output signal C2 from comparator 15 shifts to a high level. Then, output signal RT from latch circuit 21 is maintained at a high level, and output signal OR from logical operation circuit 22 is always at a high level. As a result, second turning-off switch 12 is turned off, and thus, second switching-off circuit 10 does not operate.

Accordingly, power semiconductor element 1 is turned off at a low speed by the operation of first switching-off circuit 3.

When power semiconductor element 1 is short-circuited, collector current Ic that is five times to ten times as high as that in the normal state flows through power semiconductor element 1, and interterminal voltage Vce remains at a high voltage approximately close to power supply voltage VCC (=a DC link voltage).

When the turn-off operation is performed, the Miller period during which gate-emitter voltage Vge is constant becomes shorter than that in the normal state. Gate current Ig significantly flows in the negative direction until gate-emitter voltage Vge lowers to Miller voltage VM. Then, when gate-emitter voltage Vge reaches Miller voltage VM, gate current Ig also becomes constant.

As compared with the case where the switching speed is simply continuously kept high in order to reduce a turn-off loss, the rate of change in current (dIc/dt) can be reduced, so that the surge voltage can be reduced. As a result, the surge voltage can be suppressed in the turn-off operation performed when power semiconductor element 1 is in a short-circuit state.

As described above, according to the drive circuit in the present embodiment, the turn-off operation of power semiconductor element 1 includes a time period during which the second switching-off circuit is operated when power semiconductor element 1 is in a normal state. Thereby, turn-off loss can be reduced. On the other hand, when power semiconductor element 1 is in a short-circuit state, the second switching-off circuit is prevented from operating, so that the surge voltage can be suppressed. Thus, the power conversion device including this drive circuit can be reduced in size and improved in efficiency.

According to the present embodiment, detection signal DT1 output from interterminal voltage detector 27 is used as operating time period setting signal 16 and unusual state detection signal 18. Thus, the number of components constituting the drive circuit for power semiconductor element 1 can be reduced.

The first embodiment provides an example of switching-on circuit 2 in which voltage source 4, turning-on switch 5, turning-on gate resistor 6, and node ND1 are connected in this order, but the order of connecting turning-on switch 5 and turning-on gate resistor 6 is not limited thereto. Similarly, also regarding first switching-off circuit 3, the first embodiment provides an example in which node ND1, first turning-off gate resistor 8, first turning-off switch 7, and the reference potential (GND) are connected in this order, but the order of connecting first turning-off gate resistor 8 and first turning-off switch 7 is not limited thereto. Also regarding second switching-off circuit 10, the first embodiment provides an example in which node ND1, second turning-off gate resistor 11, second turning-off switch 12, and voltage source 13 are connected in this order, but the order of connecting second turning-off gate resistor 11 and second turning-off switch 12 is not limited thereto.

Second Embodiment

Figure 4:
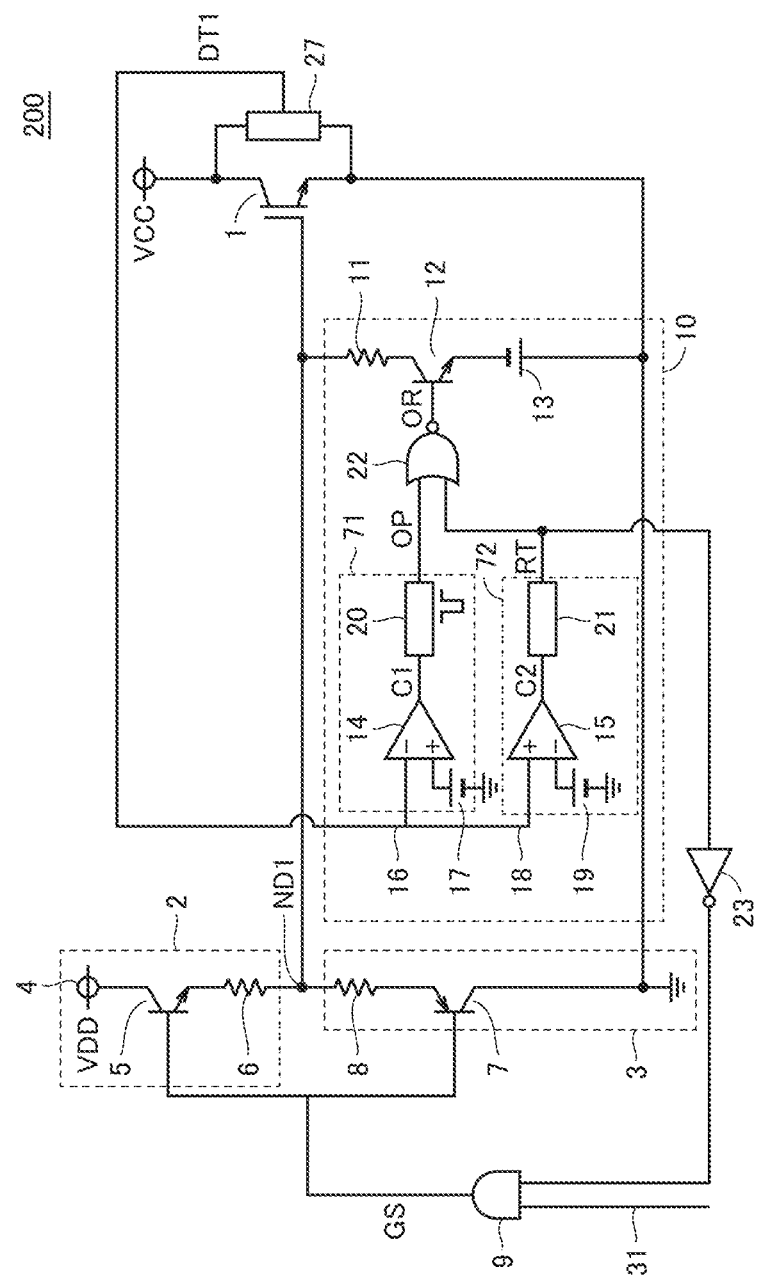
FIG. 4 is a diagram showing a configuration example of a drive circuit 200 for a power semiconductor element according to the second embodiment.

FIG. 4 is a diagram showing a configuration example of a drive circuit 200 for a power semiconductor element according to the second embodiment.

Drive circuit 200 according to the second embodiment is different from drive circuit 100 according to the first embodiment in that: logical operation circuit 22 is configured of an NOR gate; and second turning-off switch 12 is configured of an NPN transistor.

The NPN transistor is brought into a conducting state when a high-level signal is output between the base and the emitter of the NPN transistor. Thus, the NOR gate is used as logical operation circuit 22 that receives output signal OP from one-shot pulse circuit 20 and output signal RT from latch circuit 21.

Since the operations of first switching-off circuit 3 and second switching-off circuit 10 are the same as those in the first embodiment, the description thereof will not be repeated.

Third Embodiment

Figure 5:
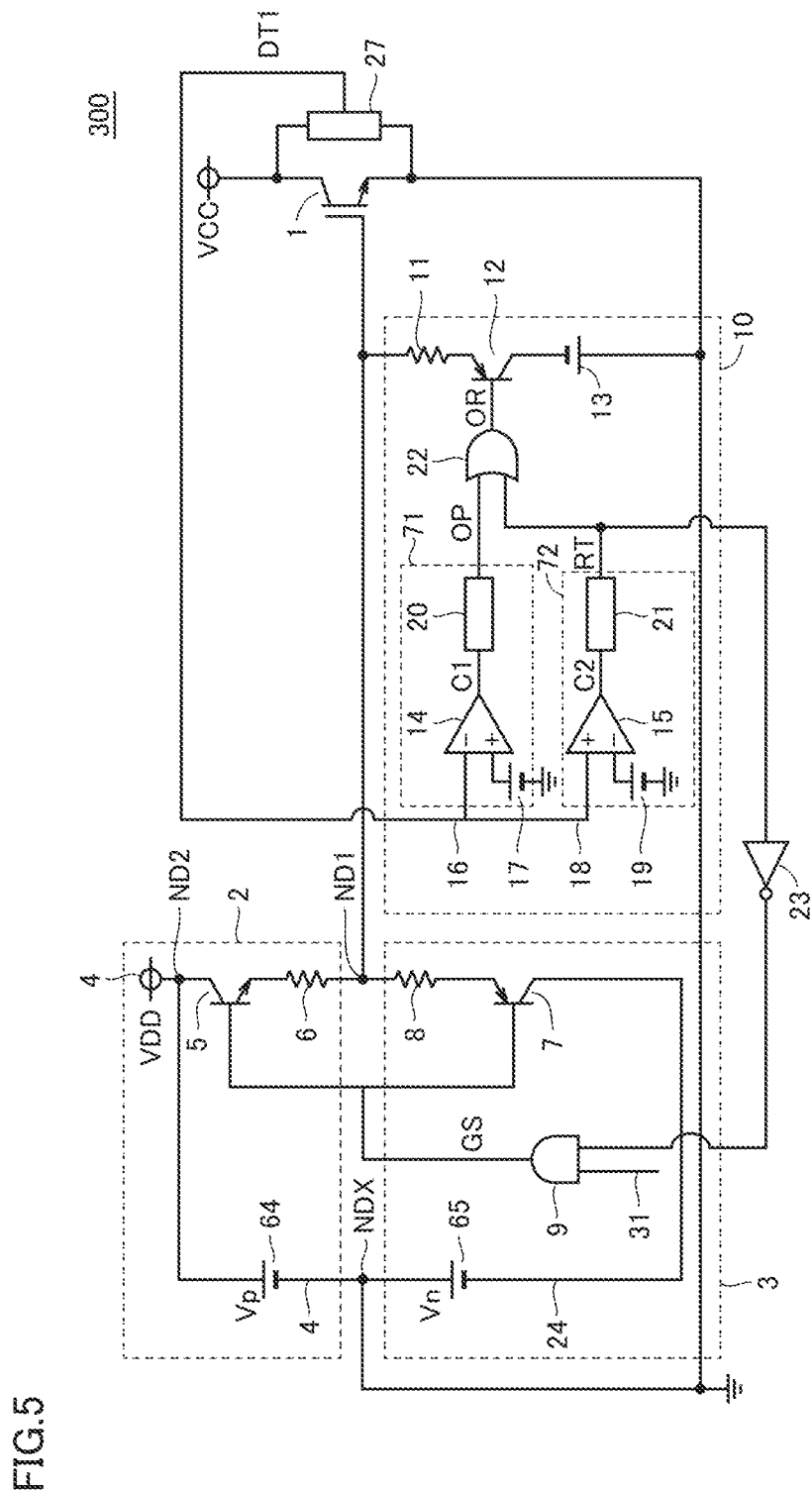
FIG. 5 is a diagram showing a configuration example of a drive circuit 300 for a power semiconductor element according to the third embodiment.

FIG. 5 is a diagram showing a configuration example of a drive circuit 300 for a power semiconductor element according to the third embodiment.

Drive circuit 300 according to the third embodiment is different from the drive circuits according to the first and second embodiments in the method of generating the power supply voltage and the reference potential (GND) in switching-on circuit 2, first switching-off circuit 3, and second switching-off circuit 10.

In the first and second embodiments, the minimum potential of first switching-off circuit 3 is a reference potential (GND), and the high potential side of voltage source 13 in second switching-off circuit 10 is connected to the reference potential (GND).

On the other hand, in the third embodiment, the maximum potential of switching-on circuit 2 and the minimum potential of first switching-off circuit 3 are configured by connecting a voltage source 64 and a voltage source 65 in series at a node NDX. This node NDX is connected to the reference potential (GND). More specifically, the high potential side of voltage source 64 is connected to a node ND2 between the first end of turning-on switch 5 and voltage source 4. The low potential side (the first end) of voltage source 65 is connected to the second end of first turning-off switch 7. The low potential side of voltage source 64 and the high potential side (the second end) of voltage source 65 are connected to node NDX. Node NDX is connected to the reference potential (GND).

The high potential side of voltage source 13 in second switching-off circuit 10 is connected to the reference potential (GND) as in the first and second embodiments.

In the turn-off operation of power semiconductor element 1, the potential of the control terminal of power semiconductor element 1 is defined as Vg. While the ON resistance value of first turning-off switch 7 is ignored, the resistance value of first turning-off gate resistor 8 is defined as Rg8. While the ON resistance value of second turning-off switch 12 is ignored, the resistance value of second turning-off gate resistor 11 is defined as Rg11, the power supply voltage on voltage source 13 is defined as V13 (<0), and the power supply voltage on voltage source 65 is defined as Vn.

First switching-off circuit 3 extracts the gate charge of power semiconductor element 1 at a maximum of (Vg+Vn)/Rg8, thereby turning off power semiconductor element 1. On the other hand, second switching-off circuit 10 extracts the electric charge of power semiconductor element 1 at a maximum of (Vg−V13)/Rg11, thereby turning off power semiconductor element 1.

Thus, by setting a power supply voltage Vn of voltage source 65, a power supply voltage V13 of voltage source 13, a resistance value Rg8 of first turning-off gate resistor 8, and a resistance value Rg11 of the second turning-off gate resistor such that (Vg+Vn)/Rg8<(Vg−V13)/Rg11, the impedance of second switching-off circuit 10 can be lowered below the impedance of first switching-off circuit 3. In particular, Rg11<Rg8 and V13<−Vn are most effective. In this case, V13<−Vn represents that the absolute value of voltage V13 on voltage source 13 is larger than the absolute value of voltage Vn on voltage source 65.

In view of the above, as in the first embodiment, the present embodiment can reduce the turn-off loss generated when power semiconductor element 1 is in a normal state, and also can suppress the surge voltage generated when power semiconductor element 1 is in an unusual state.

Modification of Third Embodiment

Figure 6:
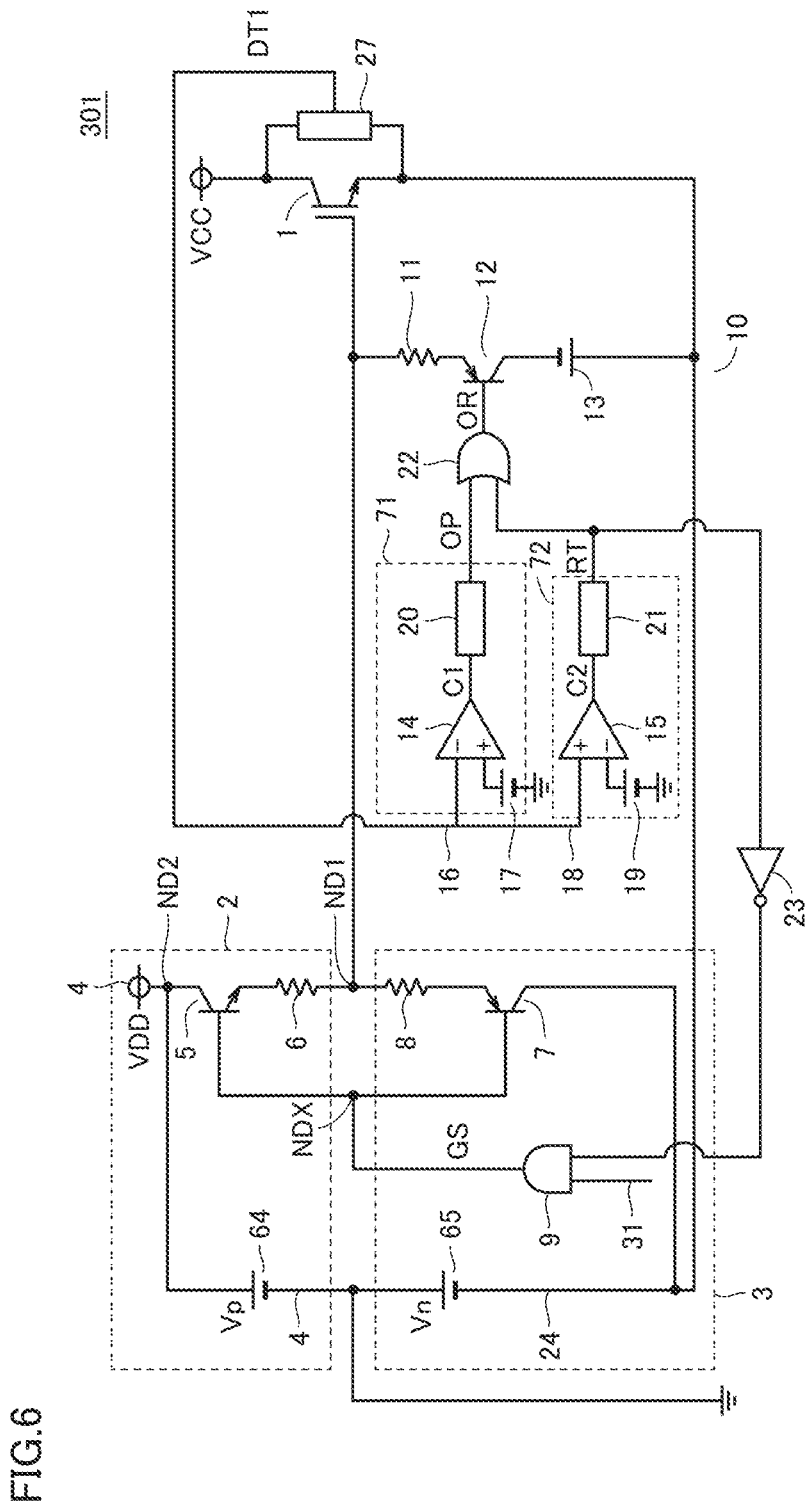
FIG. 6 is a diagram showing a configuration example of a drive circuit 301 for a power semiconductor element according to a modification of the third embodiment.

FIG. 6 is a diagram showing a configuration example of a drive circuit 301 for a power semiconductor element according to a modification of the third embodiment.

The modification of the third embodiment is different from the third embodiment in that the second terminal (the high potential side) of voltage source 13 in second switching-off circuit 10 is connected to the first terminal (the low potential side) of voltage source 65. In other words, the high potential side of voltage source 13 is connected to the potential that is lower by Vn than the reference potential (GND).

In the present modification, while the ON resistance value of second turning-off switch 12 is ignored, the resistance value of second turning-off gate resistor 11 is defined as Rg11, and the power supply voltage on voltage source 13 is defined as V13 (<0). In this case, second switching-off circuit 10 is to extract the electric charge in power semiconductor element 1 at a maximum of (Vg+Vn−V13)/Rg11.

Thus, by setting power supply voltage Vn on voltage source 65, power supply voltage V13 on voltage source 13, resistance value Rg8 of first turning-off gate resistor 8, and resistance value Rg11 of the second turning-off gate resistor such that (Vg+Vn)/Rg8<(Vg+Vn−V13)/Rg11, the impedance of second switching-off circuit 10 can be lowered below the impedance of first switching-off circuit 3. In particular, Rg11<Rg8 and V13<0 are most effective.

In view of the above, as in the first embodiment, the present embodiment can reduce the turn-off loss generated when power semiconductor element 1 is in a normal state, and also can suppress the surge voltage generated when power semiconductor element 1 is in an unusual state.

Fourth Embodiment

Figure 7:
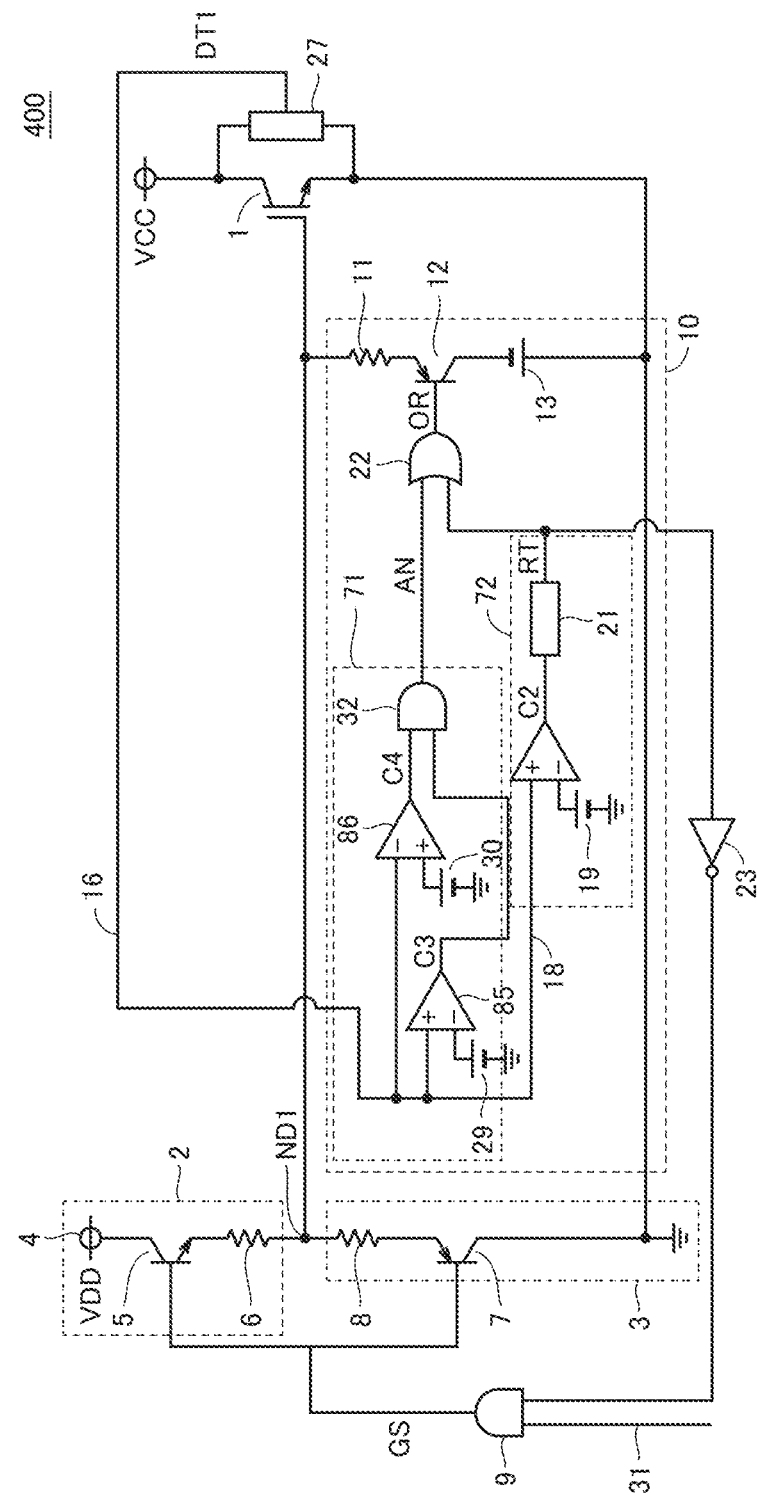
FIG. 7 is a diagram showing a configuration example of a drive circuit 400 for a power semiconductor element according to the fourth embodiment.

FIG. 7 is a diagram showing a configuration example of a drive circuit 400 for a power semiconductor element according to the fourth embodiment.

Drive circuit 400 in the fourth embodiment is different from drive circuit 100 in the first embodiment in that operating time period setting unit 71 includes a comparator 85, a comparator 86, and a logical product (AND) circuit 32 in place of comparator 14 and one-shot pulse circuit 20.

Comparator 86 receives an operating time period setting signal 16 and a reference voltage 30. Comparator 86 outputs a low-level signal when operating time period setting signal 16 is higher than reference voltage 30. Comparator 86 outputs a high-level signal when operating time period setting signal 16 is lower than reference voltage 30. Reference voltage 30 is an interterminal voltage Vce (=VCC) of power semiconductor element 1 when power semiconductor element 1 is completely turned off.

Comparator 85 receives operating time period setting signal 16 and a reference voltage 29. Comparator 85 outputs a high-level signal when operating time period setting signal 16 is higher than reference voltage 29. Comparator 85 outputs a low-level signal when operating time period setting signal 16 is lower than reference voltage 29. Reference voltage 29 is an ON voltage of power semiconductor element 1.

Logical product (AND) circuit 32 performs logical product (AND) operation of an output signal C3 from comparator 85 and an output signal C4 from comparator 86, and sends a signal AN showing the logical operation result to logical operation circuit 22.

In the above-described configuration, second turning-off switch 12 can be turned on in a time period during which the value of operating time period setting signal 16 is higher than reference voltage 29 and lower than reference voltage 30.

In view of the above, as in the first embodiment, the present embodiment can reduce the turn-off loss generated when power semiconductor element 1 is in a normal state, and also can suppress the surge voltage generated when power semiconductor element 1 is in an unusual state.

Fifth Embodiment

Figure 8:
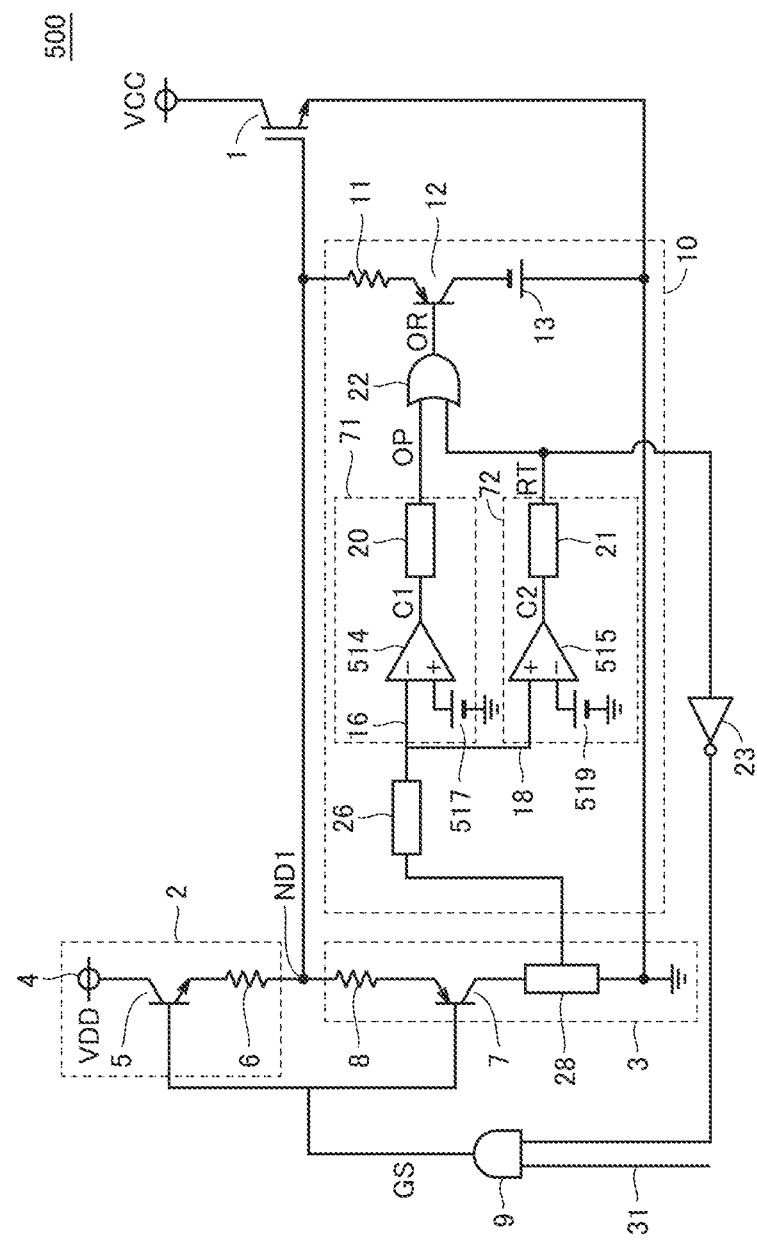
FIG. 8 is a diagram showing a configuration example of a drive circuit 500 for a power semiconductor element according to the fifth embodiment.

FIG. 8 is a diagram showing a configuration example of a drive circuit 500 for a power semiconductor element according to the fifth embodiment.

Drive circuit 500 in the fifth embodiment is different from drive circuit 100 in the first embodiment in that drive circuit 500 includes a gate current detector 28 and an integrator 26. Further, operating time period setting signal 16 and unusual state detection signal 18 in the fifth embodiment are different from those in the first embodiment.

Gate current detector 28 is arranged between the second end of second turning-off switch 12 and the reference potential (GND). Gate current detector 28 detects a gate current flowing out of the control terminal of power semiconductor element 1 in the turn-off operation.

Integrator 26 integrates the gate current detected by gate current detector 28. The output value of integrator 26 is reset at the timing of at least one of the start of turning off and the end of turning on of power semiconductor element 1.

The integrated value of the gate current in power semiconductor element 1 corresponds to the amount of gate charge flowing out of the gate terminal of power semiconductor element 1 when power semiconductor element 1 is turned off. In the present embodiment, integrator 26 outputs, as operating time period setting signal 16 and unusual state detection signal 18, a signal having a value showing the magnitude of the amount of gate charge flowing out during the turn-off operation of power semiconductor element 1.

Operating time period setting unit 71 includes a comparator 514 and a one-shot pulse circuit 20. Comparator 514 receives an operating time period setting signal 16 and a reference voltage 517. Comparator 514 outputs a low-level signal when operating time period setting signal 16 is higher than reference voltage 517. Comparator 514 outputs a high-level signal when operating time period setting signal 16 is lower than reference voltage 517. One-shot pulse circuit 20 receives an output signal C1 from comparator 514 and outputs a pulse signal having a certain time width.

Reference voltage 517 is higher than a third voltage V3 determined in advance and lower than a fourth voltage V4 determined in advance. Third voltage V3 is an absolute value of the voltage corresponding to the amount of gate charge flowing out until the gate voltage of power semiconductor element 1 reaches a prescribed value in the turn-off operation of power semiconductor element 1. Fourth voltage V4 shows a value of the voltage corresponding to the amount of gate charge flowing out until power semiconductor element 1 is completely turned off.

In the turn-off operation of power semiconductor element 1, drive circuit 500 extracts the gate charge accumulated in the gate capacitance of power semiconductor element 1. Thus, the signal having a value showing the amount of gate charge is set as operating time period setting signal 16, and thereby, the turn-off loss can be reduced.

Unusual state detection unit 72 includes a comparator 515 and a latch circuit 21. Comparator 515 receives an unusual state detection signal 18 and a reference voltage 519. Comparator 515 outputs a high-level signal when unusual state detection signal 18 is higher than reference voltage 519. Comparator 515 outputs a low-level signal when unusual state detection signal 18 is lower than reference voltage 519. Latch circuit 21 holds output signal C2 from comparator 515.

Reference voltage 519 has a predetermined magnitude. When power semiconductor element 1 is in a short-circuit state, unusual state detection signal 18 rises above reference voltage 519.

Figure 9:
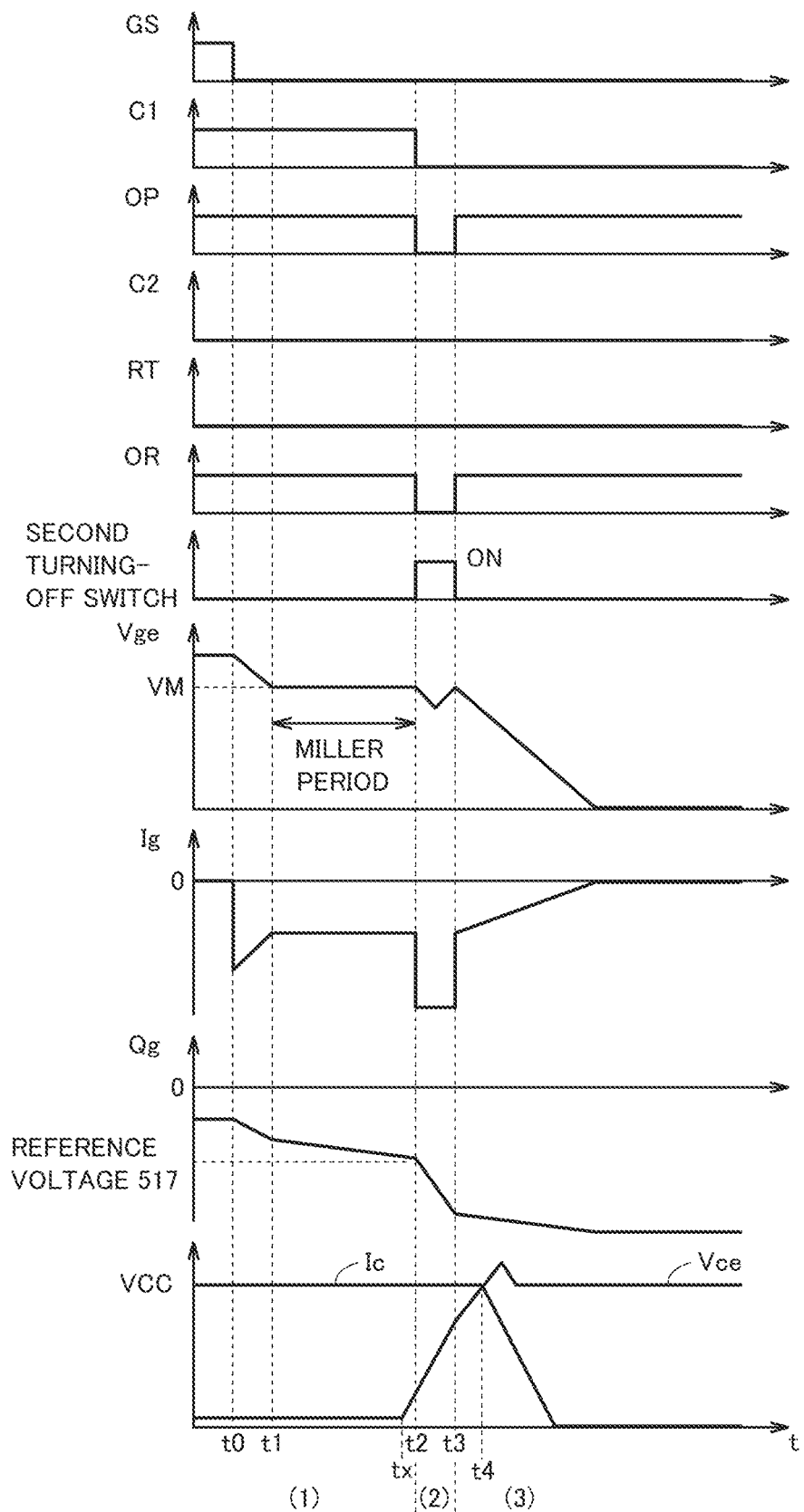
FIG. 9 is a timing chart of a turn-off operation of a power semiconductor element 1 in the fifth embodiment that is performed when power semiconductor element 1 is in a normal state.

FIG. 9 is a timing chart of a turn-off operation of a power semiconductor element 1 in the fifth embodiment that is performed when power semiconductor element 1 is in a normal state.

FIG. 9 is different from FIG. 2 in that it additionally shows transition of a charge amount Qg. Due to the turn-off operation, as the absolute value of gate current Ig decreases, the absolute value of charge amount Qg also decreases. The feedback capacitance of the power semiconductor element has voltage dependence. Thus, there is a time period in which gate-emitter voltage Vge of power semiconductor element 1 is constant (a Miller period), during which gate current Ig of power semiconductor element 1 is used to discharge the feedback capacitance of power semiconductor element 1. Then, collector current Ic decreases until interterminal voltage Vce of power semiconductor element 1 reaches voltage VCC of power supply VCC.

The impedance of second switching-off circuit 10 is set to be lower than that of first switching-off circuit 3. Thus, when second switching-off circuit 10 operates, gate-emitter voltage Vge temporarily decreases and also gate current Ig increases in the negative direction.

At a time point t2, the absolute value of charge amount Qg rises above reference voltage 517. Then, second turning-off switch 12 is in an ON state until a time point t3. Thereby, power semiconductor element 1 is turned off by second switching-off circuit 10.

By temporarily turning on second turning-off switch 12, the absolute value of charge amount Qg rapidly increases. As a result, the rate of change in interterminal voltage Vce of power semiconductor element 1 rises. In this way, the gate charge in power semiconductor element 1 can be extracted at high speed as compared with the case where the turn-off operation is performed by first switching-off circuit 3. Thereby, turn-off loss can be reduced.

As described above, when power semiconductor element 1 is in a normal state, first switching-off circuit 3 operates in a time period (1) at and before time point t2, second switching-off circuit 10 operates in a time period (2) from time point t2 to a time point t3, and first switching-off circuit 3 operates in a time period (3) at and after time point t3.

Figure 10:
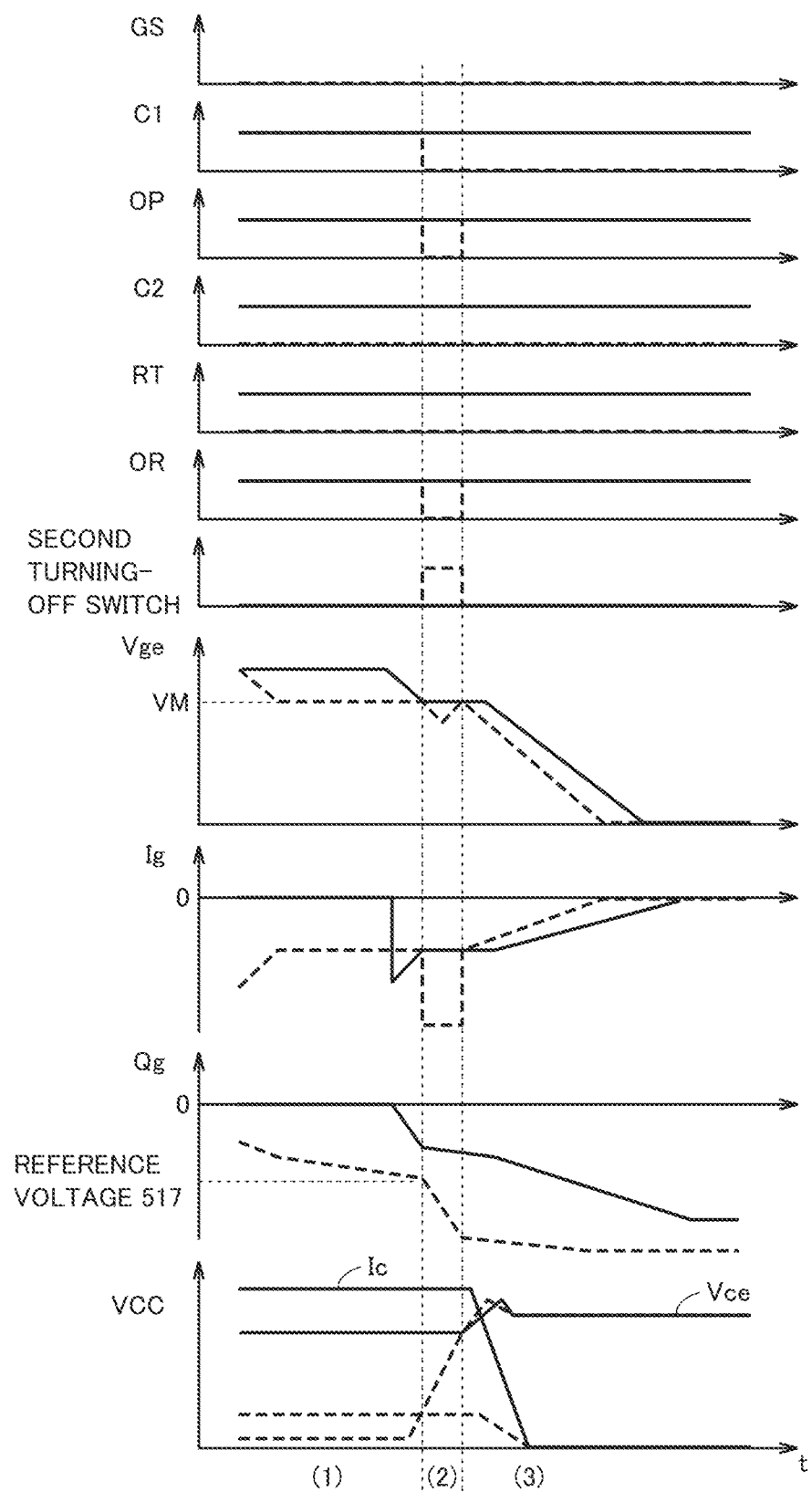
FIG. 10 is a timing chart of a turn-off operation of power semiconductor element 1 in the fifth embodiment that is performed when power semiconductor element 1 is in an unusual state.

FIG. 10 is a timing chart of a turn-off operation of power semiconductor element 1 in the fifth embodiment that is performed when power semiconductor element 1 is in an unusual state.

In FIG. 10, the time point at which the turn-off operation is started is different from that in FIG. 9. The waveform indicated by a dotted line shows a waveform in a normal state, and the waveform indicated by a solid line shows a waveform in an unusual state. FIG. 10 is different from FIG. 3 in that it additionally shows transition of charge amount Qg.

Since output signal OP from one-shot pulse circuit 20 as one input signal of logical operation circuit 22 is the same as that when power semiconductor element 1 is in a normal state, the description thereof will not be repeated.

When power semiconductor element 1 is in a short-circuit state, interterminal voltage Vce of power semiconductor element 1 is higher than reference voltage 519. As a result, output signal C2 from comparator 515 shifts to a high level. Output signal RT from latch circuit 21 is maintained at a high level, and output signal OR from logical operation circuit 22 is always at a high level. As a result, second turning-off switch 12 is turned off, so that second switching-off circuit 10 does not operate. Thus, by the operation of first switching-off circuit 3, power semiconductor element 1 is turned off at a low speed as in the first embodiment.

As in the first embodiment, also in the present embodiment, the surge voltage can be reduced since the rate of change in current (dIc/dt) can be reduced as compared with the case where the switching speed is simply continuously kept high in order to reduce the turn-off loss. As a result, the surge voltage can be suppressed in the turn-off operation performed when power semiconductor element 1 is in a short-circuit state.

As described above, according to the present embodiment, the turn-off operation of power semiconductor element 1 includes a time period during which the second switching-off circuit operates when power semiconductor element 1 is in a normal state. On the other hand, when power semiconductor element 1 is in a short-circuit state, the second switching-off circuit is prevented from operating. This consequently can reduce the turn-off loss generated when power semiconductor element 1 is in a normal state, and also can suppress the surge voltage generated when power semiconductor element 1 is in an unusual state.

Modification of Fifth Embodiment

In the fifth embodiment, the amount of gate charge in power semiconductor element 1 is obtained by integrating the signal detected by gate current detector 28. In the present modification, the voltage across the terminals of first turning-off gate resistor 8 is detected to thereby detect the voltage signal corresponding to an off-gate current. Then, this voltage signal is integrated to thereby obtain the amount of gate charge flowing out of the gate terminal of power semiconductor element 1.

Figure 11:
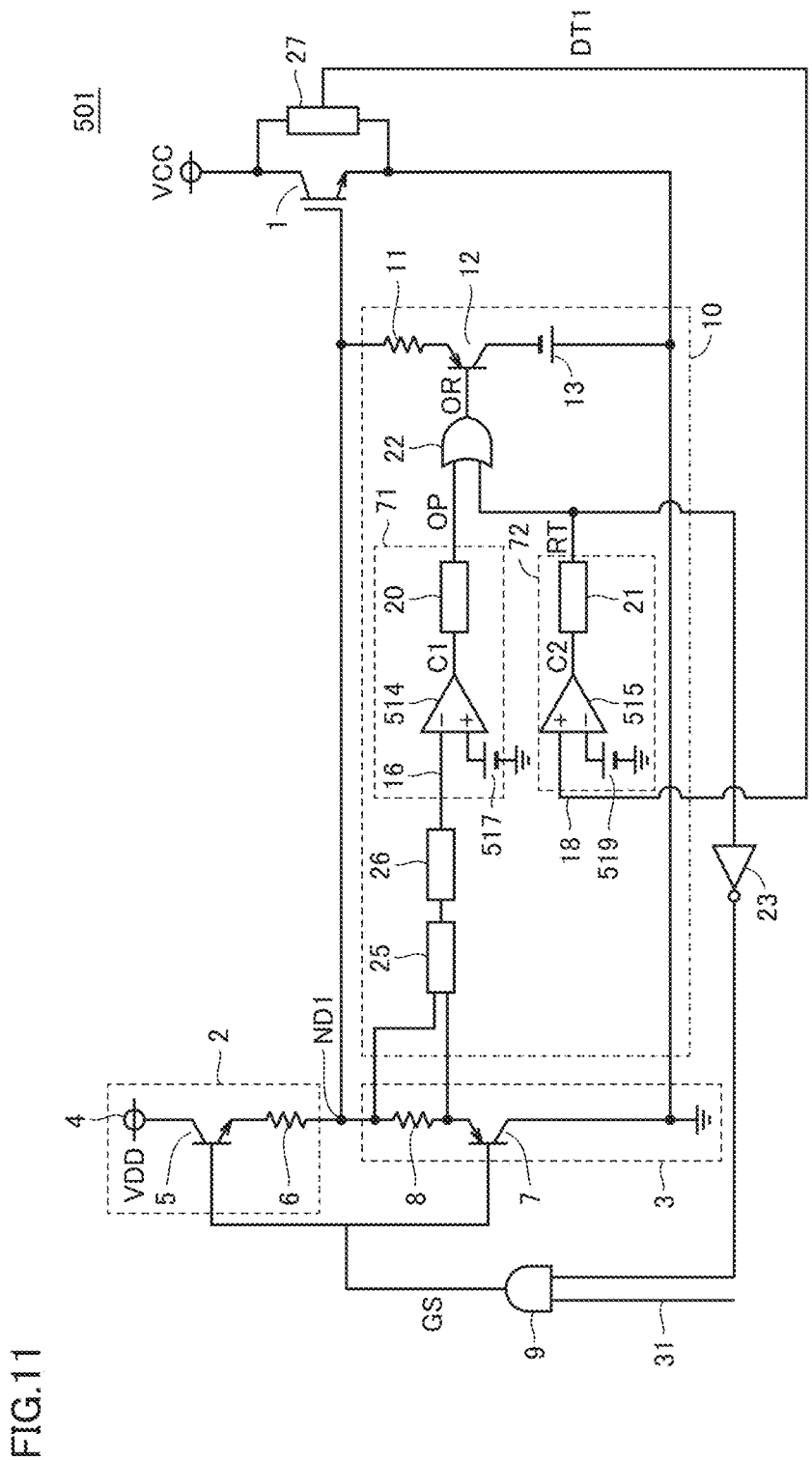
FIG. 11 is a diagram showing a configuration example of a drive circuit 501 for a power semiconductor element according to a modification of the fifth embodiment.

FIG. 11 is a diagram showing a configuration example of a drive circuit 501 for a power semiconductor element according to a modification of the fifth embodiment.

Drive circuit 501 according to the modification of the fifth embodiment is different from drive circuit 500 in the fifth embodiment in that drive circuit 501 includes a gate current detector 25.

Gate current detector 25 detects the voltage across the terminals of first turning-off gate resistor 8 to thereby detect the magnitude of the gate current flowing out of the control terminal of power semiconductor element 1 during the turn-off operation of power semiconductor element 1.

Integrator 26 integrates the gate current detected by gate current detector 25.

The integrated value of the gate current flowing out of the gate terminal of power semiconductor element 1 corresponds to the amount of gate charge in power semiconductor element 1. Thus, the signal having a value showing the magnitude of the amount of gate charge flowing out in the turn-off operation of power semiconductor element 1 that is obtained by integrator 26 is defined as operating time period setting signal 16 and unusual state detection signal 18.

The turn-off operations of power semiconductor element 1 in the present modification that are performed when power semiconductor element 1 is in the normal state and in the unusual state are the same as those in the embodiments, and therefore, the description thereof will not be repeated.

As in the first embodiment, the present modification can reduce the turn-off loss generated when power semiconductor element 1 is in a normal state, and also can suppress the surge voltage generated when power semiconductor element 1 is in an unusual state.

Sixth Embodiment

In the first to fifth embodiments, the unusual state is defined as a short-circuit state. In the sixth embodiment, the unusual state is defined as an overcurrent state.

Figure 12:
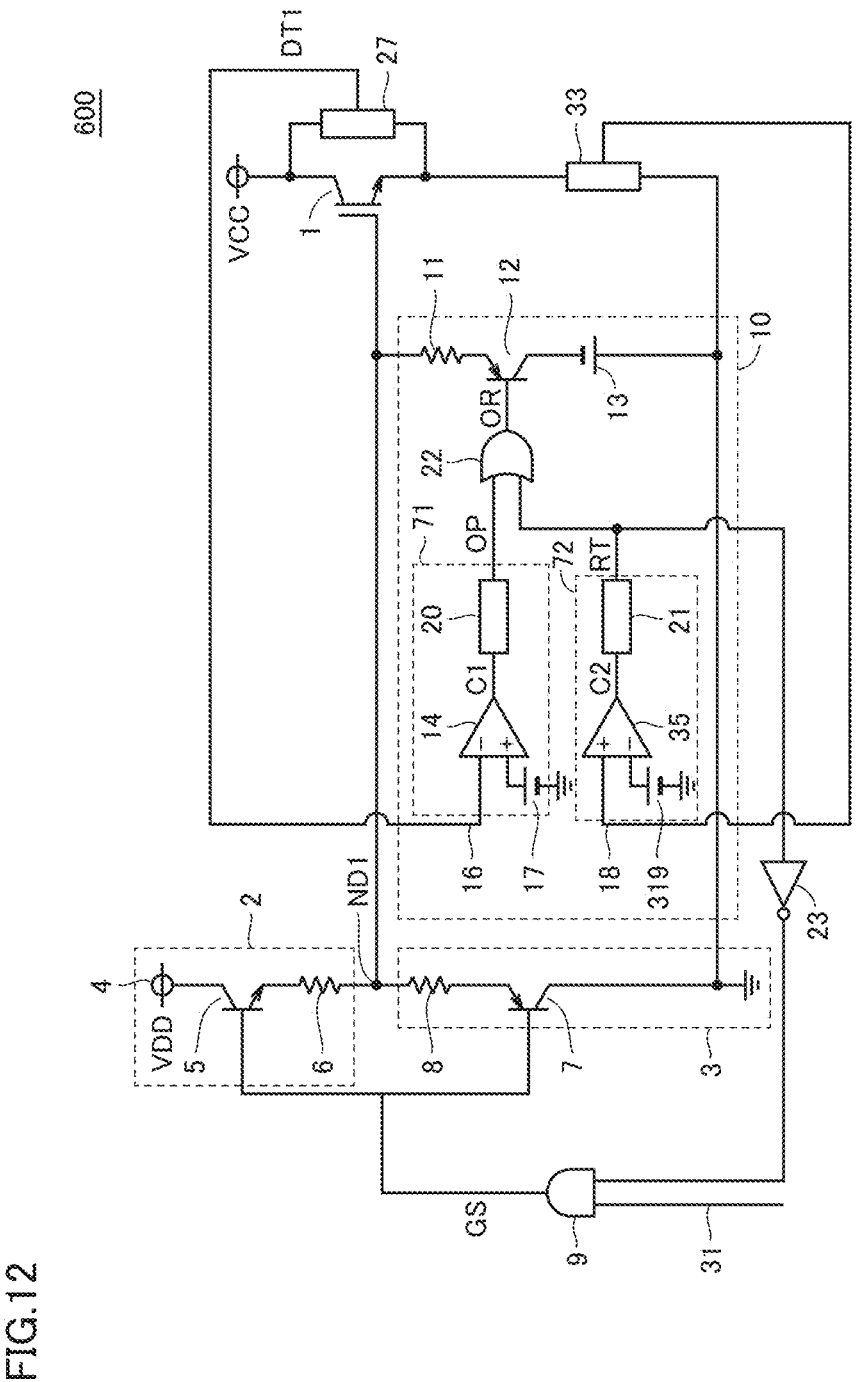
FIG. 12 is a diagram showing a configuration example of a drive circuit 600 for a power semiconductor element according to the sixth embodiment.

FIG. 12 is a diagram showing a configuration example of a drive circuit 600 for a power semiconductor element according to the sixth embodiment.

Drive circuit 600 in the sixth embodiment is different from drive circuit 100 in the first embodiment in that drive circuit 600 includes a current detector 33 for detecting an overcurrent state in power semiconductor element 1.

Current detector 33 is arranged between the second main electrode of power semiconductor element 1 and the reference potential (GND). Current detector 33 detects a current Ic flowing between the main electrodes of power semiconductor element 1 and outputs a detection signal DT2 having a value showing the magnitude of the detected current Ic.

In the present embodiment, unusual state detection signal 18 is defined as detection signal DT2 output from current detector 33, and unusual state detection unit 72 detects whether power semiconductor element 1 is in an overcurrent state or not.

Unusual state detection unit 72 includes a comparator 35 and a latch circuit 21. Comparator 35 receives an unusual state detection signal 18 and a reference voltage 319. When unusual state detection signal 18 is higher than reference voltage 319, comparator 35 outputs a high-level signal to latch circuit 21. When unusual state detection signal 18 is lower than reference voltage 319, comparator 35 outputs a low-level signal to latch circuit 21. Latch circuit 21 holds an output signal C2 form comparator 35. Reference voltage 319 has a predetermined magnitude. When power semiconductor element 1 is in an overcurrent state, unusual state detection signal 18 becomes higher than reference voltage 319.

In the present embodiment, detection signal DT1 output from interterminal voltage detector 27 is defined as operating time period setting signal 16 as in the first embodiment.

The turn-off operations of power semiconductor element 1 in the present embodiment that are performed when power semiconductor element 1 is in the normal state and in the unusual state are the same as those in the first embodiment, and therefore, the description thereof will not be repeated.

As in the first embodiment, the present embodiment can also reduce the turn-off loss generated when power semiconductor element 1 is in a normal state, and can suppress the surge voltage generated when power semiconductor element 1 is in an unusual state.

In addition to the current detector, the means for detecting an overcurrent may also include an interterminal voltage of power semiconductor element 1, a temperature detector, and the like.

Seventh Embodiment

In the sixth embodiment, detection signal DT1 output from interterminal voltage detector 27 is defined as operating time period setting signal 16. In the present embodiment, the signal having a value showing the amount of gate charge in power semiconductor element 1 is defined as operating time period setting signal 16 as in the modification of the fifth embodiment.

Figure 13:
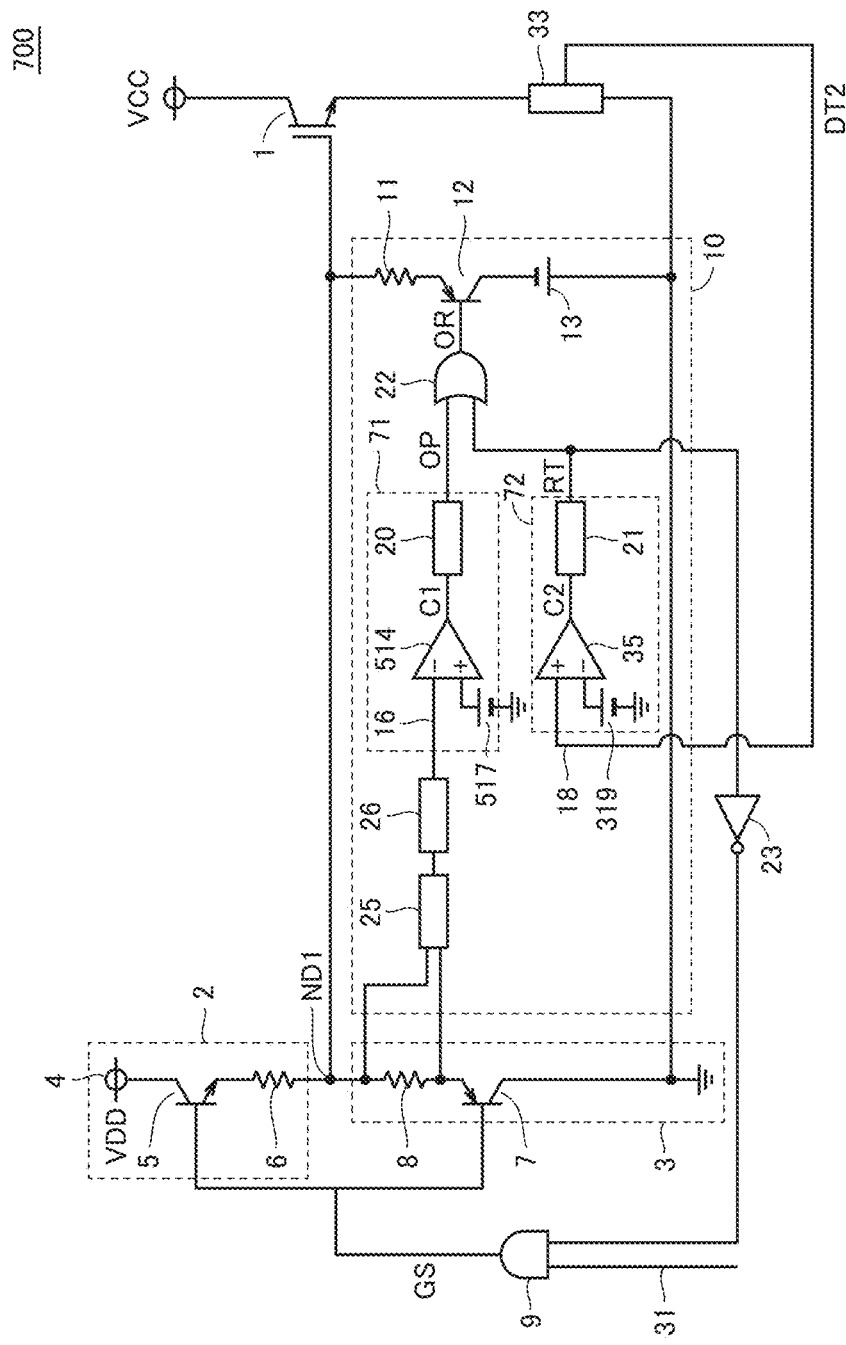
FIG. 13 is a diagram showing a configuration example of a drive circuit 700 for a power semiconductor element according to the seventh embodiment.

FIG. 13 is a diagram showing a configuration example of a drive circuit 700 for a power semiconductor element according to the seventh embodiment.

Drive circuit 700 in the seventh embodiment is different from drive circuit 600 in the sixth embodiment in that second switching-off circuit 10 in drive circuit 700 includes gate current detector 25 and integrator 26.

Gate current detector 25 detects the voltage across the terminals of first turning-off gate resistor 8 to thereby detect the magnitude of the gate current flowing out of the control terminal of power semiconductor element 1 during the turn-off operation of power semiconductor element 1.

Integrator 26 integrates the gate current detected by gate current detector 25.

The integrated value of the gate current of power semiconductor element 1 corresponds to the amount of gate charge in power semiconductor element 1. Thus, the signal having a value showing the magnitude of the amount of the gate charge flowing out during the turn-off operation of power semiconductor element 1 that is obtained by integrator 26 is defined as operating time period setting signal 16.

The turn-off operations of power semiconductor element 1 in the present embodiment that are performed when power semiconductor element 1 is in the normal state and in the unusual state are the same as those in the first embodiment, and therefore, the description thereof will not be repeated.

As in the first embodiment, the present embodiment can also reduce the turn-off loss generated when power semiconductor element 1 is in a normal state, and can suppress the surge voltage generated when power semiconductor element 1 is in an unusual state.

Eighth Embodiment

In the eighth embodiment, the unusual state is defined as an overheated state.

Figure 14:
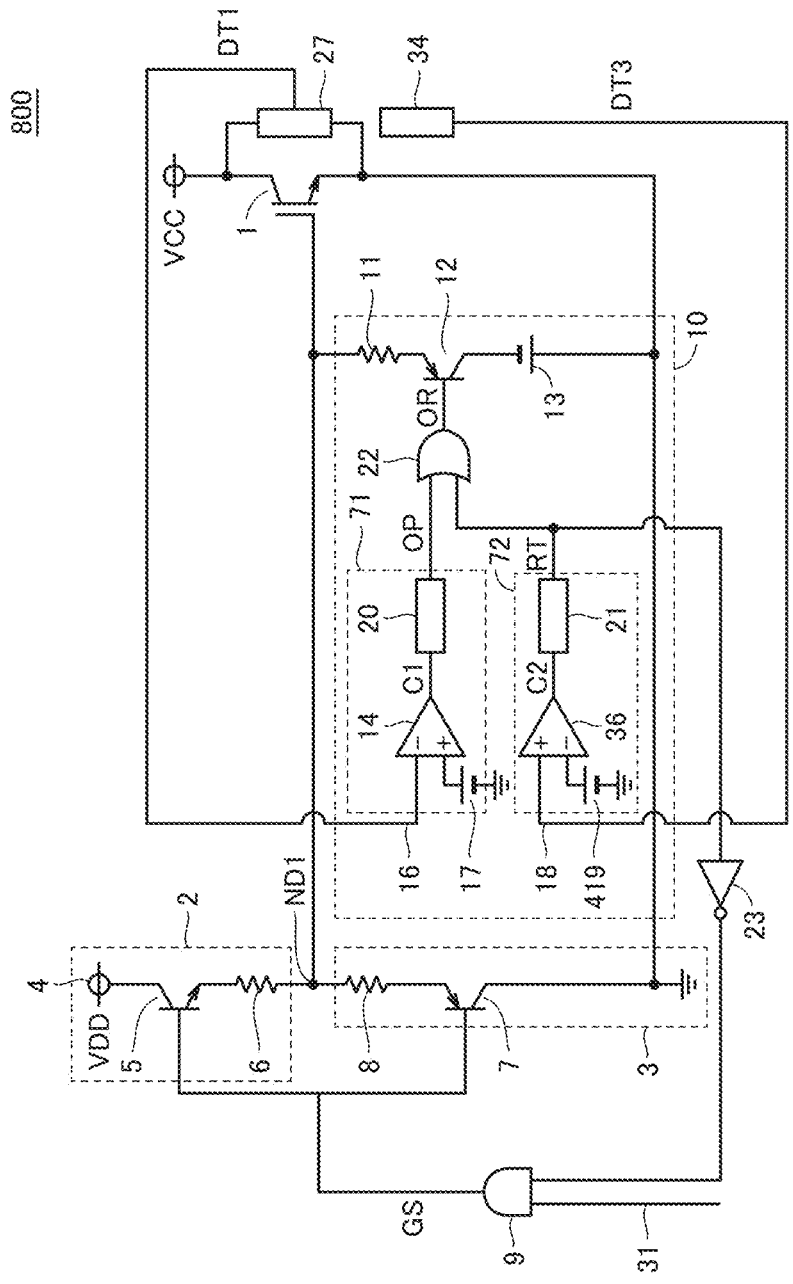
FIG. 14 is a diagram showing a configuration example of a drive circuit 800 for a power semiconductor element according to the eighth embodiment.

FIG. 14 is a diagram showing a configuration example of a drive circuit 800 for a power semiconductor element according to the eighth embodiment.

Drive circuit 800 in the eighth embodiment is different from drive circuit 100 in the first embodiment in that drive circuit 800 includes a temperature detector 34 for detecting the overheated state of power semiconductor element 1.

Temperature detector 34 is arranged in the vicinity of power semiconductor element 1. Temperature detector 34 detects a temperature Tj of power semiconductor element 1 and outputs a detection signal DT3 having a value showing the detected temperature Tj. Temperature detector 34 is configured of a thermistor or an on-chip temperature sensor.

In the present embodiment, unusual state detection signal 18 is defined as detection signal DT3 output from temperature detector 34, and unusual state detection unit 72 detects whether power semiconductor element 1 is in an overheated state or not.

Unusual state detection unit 72 includes a comparator 36 and a latch circuit 21. Comparator 36 receives unusual state detection signal 18 and a reference voltage 419. When unusual state detection signal 18 is higher than reference voltage 419, comparator 36 outputs a high-level signal to latch circuit 21. When unusual state detection signal 18 is lower than reference voltage 419, comparator 36 outputs a low-level signal to latch circuit 21. Latch circuit 21 holds an output signal C2 from comparator 36. Reference voltage 419 has a predetermined magnitude. When power semiconductor element 1 is in an overheated state, unusual state detection signal 18 rises above reference voltage 419.

In the present embodiment, detection signal DT1 output from interterminal voltage detector 27 is defined as operating time period setting signal 16, as in the first embodiment.

The turn-off operations of power semiconductor element 1 in the present embodiment that are performed when power semiconductor element 1 is in the normal state and in the unusual state are the same as those in the first embodiment, and therefore, the description thereof will not be repeated.

As in the first embodiment, the present embodiment can also reduce the turn-off loss generated when power semiconductor element 1 is in a normal state, and can suppress the surge voltage generated when power semiconductor element 1 is in an unusual state.

Ninth Embodiment

In the eighth embodiment, detection signal DT1 output from interterminal voltage detector 27 is defined as operating time period setting signal 16. In the present embodiment, the signal having a value showing the amount of gate charge in power semiconductor element 1 is defined as operating time period setting signal 16 as in the modification of the fifth embodiment and the seventh embodiment.

Figure 15:
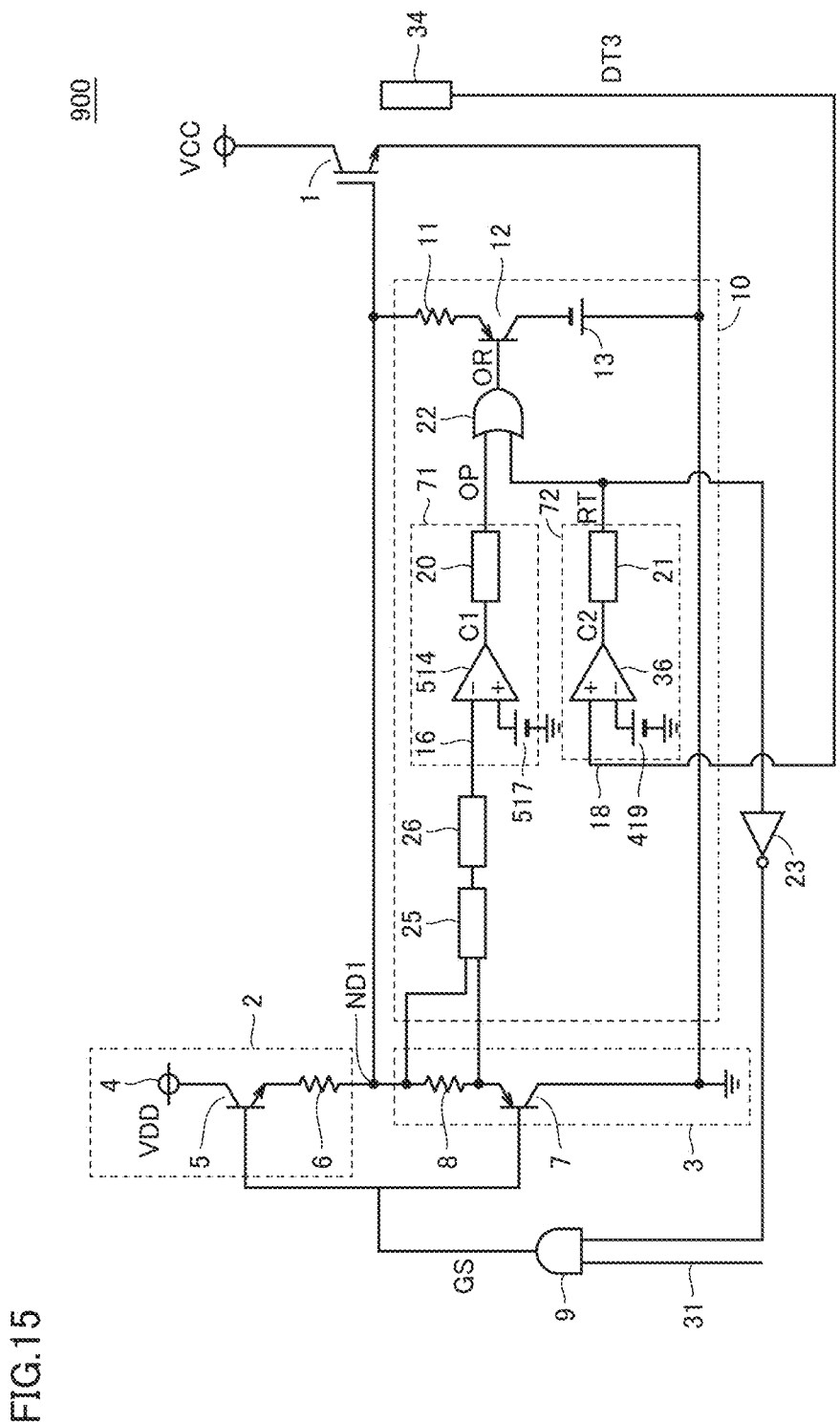
FIG. 15 is a diagram showing a configuration example of a drive circuit 900 for a power semiconductor element according to the ninth embodiment.

FIG. 15 is a diagram showing a configuration example of a drive circuit 900 for a power semiconductor element according to the ninth embodiment.

Drive circuit 900 in the ninth embodiment is different from drive circuit 800 in the eighth embodiment in that second switching-off circuit 10 in drive circuit 900 includes a gate current detector 25 and an integrator 26.

Gate current detector 25 detects the voltage across the terminals of first turning-off gate resistor 8 to thereby detect the magnitude of the gate current flowing out of the gate terminal of power semiconductor element 1 during the turn-off operation of power semiconductor element 1.

Integrator 26 integrates the gate current detected by gate current detector 25.

The integrated value of the gate current of power semiconductor element 1 corresponds to the amount of gate charge in power semiconductor element 1. Thus, the signal having a value showing the magnitude of the amount of the gate charge flowing out during the turn-off operation of power semiconductor element 1 that is obtained by integrator 26 is defined as operating time period setting signal 16.

The turn-off operations of power semiconductor element 1 in the present embodiment that are performed when power semiconductor element 1 is in the normal state and in the unusual state are the same as those in the first embodiment, and therefore, the description thereof will not be repeated.

As in the first embodiment, the present embodiment can also reduce the turn-off loss generated when power semiconductor element 1 is in a normal state, and can suppress the surge voltage generated when power semiconductor element 1 is in an unusual state.

Tenth Embodiment

In the present embodiment, the drive circuit for a power semiconductor element according to any one of the above-mentioned first to ninth embodiments is applied to a power conversion device. The present invention is not limited to a specific power conversion device, and the following describes the case where the present invention is applied to a three-phase inverter as the tenth embodiment.

Figure 16:
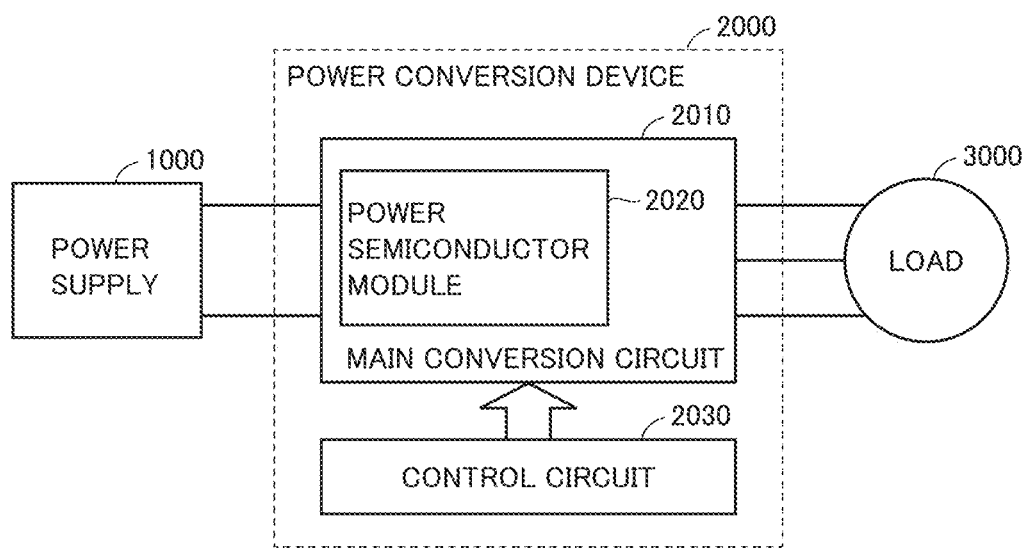
FIG. 16 is a block diagram showing a configuration of a power conversion system to which a power conversion device according to the tenth embodiment is applied.

FIG. 16 is a block diagram showing a configuration of a power conversion system to which a power conversion device according to the tenth embodiment is applied.

The power conversion system shown in FIG. 16 includes a power supply 1000, a power conversion device 2000, and a load 3000. Power supply 1000 is a DC power supply and supplies DC power to power conversion device 2000. Power supply 1000 can be configured of various types of devices, and may be configured of a DC system, a photovoltaic cell, or a storage battery, for example, or may be configured of a rectifier circuit connected to an alternating-current (AC) system or configured of an AC/DC converter. Also, power supply 1000 may be configured of a DC/DC converter that converts DC power output from the DC system into predetermined power.

Power conversion device 2000, which is a three-phase inverter connected between power supply 1000 and load 3000, converts the DC power supplied from power supply 1000 into AC power, and supplies the converted AC power to load 3000. Power conversion device 2000 includes: a main conversion circuit 2010 that converts DC power into AC power and outputs the converted AC power; and a control circuit 2030 that outputs a control signal for controlling main conversion circuit 2010 to main conversion circuit 2010.

Load 3000 is a three-phase electric motor driven by AC power supplied from power conversion device 2000. Load 3000 is not limited to a specific application, but is an electric motor mounted on each of various electric devices and used as an electric motor, for example, for a hybrid vehicle, an electric vehicle, a rolling stock, an elevator, or an air conditioner.

The following is an explanation about the details of power conversion device 2000. Main conversion circuit 2010 includes power semiconductor element 1 as a switching element described in the first to ninth embodiments and a freewheeling diode (each of which is not shown). By switching of the switching element, the DC power supplied from power supply 1000 is converted into AC power and supplied to load 3000. While the specific circuit configuration of main conversion circuit 2010 may be of various types, main conversion circuit 2010 according to the present embodiment is a three-phase full bridge circuit configured in two levels, and may be configured of six switching elements and six freewheeling diodes that are connected in antiparallel to the respective six switching elements.

Six switching elements are configured such that each two switching elements are connected in series to form an upper arm and a lower arm. Each of the pairs of upper and lower arms forms a corresponding phase (a U-phase, a V-phase, and a W-phase) of a full bridge circuit. The output terminals of the upper and lower arms, that is, three output terminals of main conversion circuit 2010, are connected to load 3000.

Although the drive circuit described in the first to ninth embodiments for driving each switching element may be provided separately from power semiconductor module 2020, the drive circuit is incorporated in power semiconductor module 2020 in the tenth embodiment. Power semiconductor module 2020 includes the drive circuit described in the first to ninth embodiments. The drive circuit generates a drive signal for driving each switching element in main conversion circuit 2010, and supplies the generated drive signal to the control electrode of each switching element in main conversion circuit 2010. Specifically, according to the control signal from control circuit 2030, the drive circuit outputs the drive signal for turning on each switching element and the drive signal for turning off each switching element to the control electrode of each switching element. When the switching element is maintained in an ON state, the drive signal is a voltage signal (an ON signal) equal to or greater than a threshold voltage of the switching element. When the switching element is maintained in an OFF state, the drive signal is a voltage signal (an OFF signal) equal to or less than the threshold voltage of the switching element.

Control circuit 2030 controls each switching element in main conversion circuit 2010 so as to supply desired electric power to load 3000. Specifically, the time (ON time) at which each switching element in main conversion circuit 2010 is to be in an ON state is calculated based on the electric power to be supplied to load 3000. For example, control circuit 2030 can control main conversion circuit 2010 by pulse width modulation (PWM) control for modulating the ON time of each switching element according to the voltage to be output. Then, control circuit 2030 outputs a control command (control signal) to the drive circuit included in main conversion circuit 2010 such that an ON signal is output to the switching element that is to be in an ON state at each point of time and such that an OFF signal is output to the switching element that is to be in an OFF state at each point of time. According to this control signal, the drive circuit outputs an ON signal or an OFF signal as a drive signal to the control electrode of each switching element.

In the power conversion device according to the present embodiment, since main conversion circuit 2010 includes the drive circuit described in the first to ninth embodiments, both turn-off loss and electromagnetic noise can be reduced when each switching element is turned off.

The present embodiment has been described with reference to the example in which the present invention is applied to a three-phase inverter configured in two levels, but the present invention is not limited thereto and is applicable to various types of power conversion devices. In the present embodiment, the power conversion device is configured in two levels, but the power conversion device may be configured in three levels or in a multilevel. When electric power is supplied to a single-phase load, the present invention may be applied to a single-phase inverter. Also, when electric power is supplied to a DC load or the like, the present invention may also be applicable to a DC/DC converter or an AC/DC converter.

Further, the power conversion device to which the present invention is applied is not limited to the case where the above-mentioned load is an electric motor, but may also be used as a power supply device for an electrical discharge machine, a laser drilling machine, an induction heating cooker, or a wireless power transfer system, or may also be used as a power conditioner for a photovoltaic power system, a power storage system or the like.

It should be understood that the embodiments disclosed herein are illustrative and non-restrictive in every respect. The scope of the present invention is defined by the terms of the claims, rather than the description above, and is intended to include any modifications within the meaning and scope equivalent to the terms of the claims.

REFERENCE SIGNS LIST 1 power semiconductor element, 2 switching-on circuit, 3 first switching-off circuit, 5 turning-on switch, 6 turning-on gate resistor, 7 first turning-off switch, 8 turning-off gate resistor, 9 gate operating command circuit, 10 second switching-off circuit, 11 second turning-off gate resistor, 12 second turning-off switch, 4, 13, 64, 65 voltage source, 14, 15, 35, 36, 85, 86, 514, 515 comparator, 16 operating time period setting signal, 17, 19, 29, 30, 319, 419, 517, 519 reference voltage, 18 unusual operation detection signal, 20 one-shot pulse circuit, 21 latch circuit, 22 logical operation circuit, 23 inverting circuit, 26 integrator, 27 interterminal voltage detector 25, 28 gate current detector, 31 gate command, 32 logical product (AND) circuit, 33 current detector, 34 temperature detector, 71 operating time period setting unit, 72 unusual state detection unit, 1000 power supply, 2000 power conversion device, 2010 main conversion circuit, 2020 semiconductor module, 2030 control circuit, 3000 load.

The invention claimed is:

1. A drive circuit for a power semiconductor element, the drive circuit serving to drive the power semiconductor element including a control terminal, a first main electrode, and a second main electrode, the drive circuit comprising:
a first switching-off circuit and a second switching-off circuit each to turn off the power semiconductor element, wherein
an impedance of the second switching-off circuit is lower than that of the first switching-off circuit, and
in a case where the power semiconductor element is turned off,
only the first switching-off circuit operates when the power semiconductor element is in an unusual state, and
the first switching-off circuit and the second switching-off circuit complementarily operate in an order of the first switching-off circuit, the second switching-off circuit, and the first switching-off circuit when the power semiconductor element is in a normal state.

2. The drive circuit for a power semiconductor element according to claim 1, wherein
the first switching-off circuit includes
a first turning-off gate resistor and a first turning-off switch between the control terminal of the power semiconductor element and a reference potential,
the second switching-off circuit includes a second turning-off gate resistor, a second turning-off switch, and a voltage source between the control terminal of the power semiconductor element and the reference potential,
a terminal on a high potential side of the voltage source is connected to the reference potential, and
the resistance value of the first turning-off gate resistor is greater than that of the second turning-off gate resistor.

3. The drive circuit for a power semiconductor element according to claim 1, wherein
the first switching-off circuit includes
a first turning-off gate resistor, a first turning-off switch, and a first voltage source between the control terminal of the power semiconductor element and a reference potential,
a terminal on a high potential side of the first voltage source is connected to the reference potential,
the second switching-off circuit includes
a second turning-off gate resistor, a second turning-off switch, and a second voltage source between the control terminal of the power semiconductor element and the reference potential,
a terminal on a high potential side of the second voltage source is connected to the reference potential, and
the resistance value of the first turning-off resistor is greater than that of the second turning-off gate resistor, and the voltage of the first voltage source is lower than that of the second voltage source.

4. The drive circuit for a power semiconductor element according to claim 1, wherein
the first switching-off circuit includes
a first turning-off gate resistor, a first turning-off switch, and a first voltage source between the control terminal of the power semiconductor element and a reference potential,
a terminal on a high potential side of the first voltage source is connected to the reference potential,
the second switching-off circuit includes
a second turning-off gate resistor, a second turning-off switch, and a second voltage source between the control terminal of the power semiconductor element and the reference potential,
a terminal on a high potential side of the second voltage source is connected to a low potential side of the first voltage source, and
the resistance value of the first turning-off gate resistor is greater than that of the second turning-off gate resistor.

5. The drive circuit for a power semiconductor element according to claim 2, wherein
the second switching-off circuit includes
an operating time period setting unit to set a time period during which the second switching-off circuit operates,
an unusual state detection unit to detect the unusual state of the power semiconductor element, and
a logical operation circuit to perform a logical operation of an output of the operating time period setting unit and an output of the unusual state detection unit, and an output of the logical operation circuit is connected to a control terminal of the second turning-off switch.

6. The drive circuit for a power semiconductor element according to claim 5, further comprising an interterminal voltage detector to
detect an interterminal voltage between the first main electrode and the second main electrode of the power semiconductor element, and output an operating time period setting signal having a value showing the interterminal voltage, wherein the operating time period setting unit includes
a first comparator to compare the operating time period setting signal with a first reference voltage, and
a one-shot pulse circuit to receive an output from the first comparator, wherein an output from the one-shot pulse circuit is sent to the logical operation circuit, the first reference voltage is higher than a first voltage determined in advance and lower than a second voltage determined in advance, the first voltage is an interterminal voltage between the first main electrode and the second main electrode in the power semiconductor element in a conducting Mate, and the second voltage is an interterminal voltage between the first main electrode and the second main electrode in the power semiconductor element in a blocking state.

7. The drive circuit for a power semiconductor element according to claim 5, further comprising an interterminal voltage detector to
detect an interterminal between the first main electrode and the second main electrode in the power semiconductor element, and
output an operating time period setting signal having a value showing the interterminal voltage, wherein
the operating time period setting unit includes
a second comparator to compare the operating time period setting signal with a second reference voltage,
a third comparator to compare the operating time period setting signal with a third reference voltage, and
a logical product circuit to output a logical product of an output from the second comparator and an output from the third comparator, wherein an output from the logical product circuit is sent to the logical operation circuit, the second reference voltage is an interterminal voltage between the first main electrode and the second main electrode in the power semiconductor element in a conducting state, and the third reference voltage is an interterminal voltage between the first main electrode and the second main electrode in the power semiconductor element in a blocking state.

8. The drive circuit for a power semiconductor element according to claim 5, further comprising:
a gate current detection unit to detect a gate current flowing out of the control terminal of the power semiconductor element; and
an integrator to
integrate an output signal from the gate current detection unit, and
output an operating time period setting signal having a value showing an amount of a gate charge flowing out of the control terminal of the power semiconductor element, wherein
the operating time period setting unit includes
a fourth comparator to compare the operating time period setting signal with a fourth reference voltage, and
a one-shot pulse circuit to receive an output from the fourth comparator, wherein an output from the one-shot pulse circuit is sent to the logical operation circuit, the fourth reference voltage is higher than a third voltage determined in advance and lower than a fourth voltage determined in advance, the third voltage is an absolute value of a voltage corresponding to the amount of the gate charge flowing out until a gate voltage of the power semiconductor element reaches a prescribed value when the power semiconductor element is turned off, and the fourth voltage is an absolute value of a voltage corresponding to the amount of the gate charge flowing out until the power semiconductor element is in a blocking state.

9. The drive circuit for a power semiconductor element according to claim 5, further comprising an interterminal voltage detector
detect an interterminal voltage between the first main electrode and the second main electrode in the power semiconductor element, and
output an unusual state detection signal having a value showing the interterminal voltage, wherein
the unusual state detection unit includes a fifth comparator to compare the error state detection signal with a fifth reference voltage, and
based on a comparison result of the fifth comparator, the unusual state detection unit detects whether the power semiconductor element is in a short-circuit state or not.

10. The drive circuit for a power semiconductor element according to claim 5, further comprising:
a gate current detection unit to detect a gate current flowing out of the control terminal of the power semiconductor element;
an integrator to
integrate an output signal from the gate current detection unit, and
output an unusual state detection signal having a value showing an amount of a gate charge flowing out of the control terminal of the power semiconductor element, wherein
the unusual state detection unit includes a sixth comparator to compare the unusual state detection signal with a sixth reference voltage, and
based on a comparison result of the sixth comparator, the unusual state detection unit detects whether the power semiconductor element is in a short-circuit state or not.

11. The drive circuit for a power semiconductor element according to claim 5, further comprising a current detection unit to
detect a magnitude of a current flowing between main electrodes of the power semiconductor element, and
output an unusual state detection signal having a value showing the magnitude of the current, wherein
the unusual state detection unit includes a seventh comparator to compare the unusual state detection signal with a seventh reference voltage, and
based on a comparison result of the seventh comparator, the unusual state detection unit detects whether the power semiconductor element is in an overcurrent state or not.

12. The drive circuit for a power semiconductor element according to claim 5, further comprising a temperature detection unit to
detect a temperature of the power semiconductor element, and
output an unusual state detection signal having a value showing the temperature, wherein the unusual state detection unit includes an eighth comparator to compare the unusual state detection signal with an eighth reference voltage, and based on a comparison result of the eighth comparator, the unusual state detection unit detects whether the power semiconductor element is in an overheated state or not.

13. A power semiconductor module comprising:
a power semiconductor element; and
the drive circuit for the power semiconductor element according to claim 1, wherein the drive circuit serves to drive the power semiconductor element.

14. The drive circuit for a power semiconductor element according to claim 3, wherein
the second switching-off circuit includes
an operating time period setting unit to set a time period during which the second switching-off circuit operates,
an unusual state detection unit to detect the unusual state of the power semiconductor element, and
a logical operation circuit to perform a logical operation of an output of the operating time period setting unit and an output of the unusual state detection unit, and an output of the logical operation circuit is connected to a control terminal of the second turning-off switch.

15. The drive circuit for a power semiconductor element according to claim 4, wherein
the second switching-oft circuit includes
an operating time period setting unit to set a time period during which the second switching-off circuit operates,
an unusual state detection unit to detect the unusual state of the power semiconductor element, and
a logical operation circuit to perform a logical operation of an output of the operating time period setting unit and an output of the unusual state detection unit, and an output of the logical operation circuit is connected to a control terminal of the second turning-off switch.

* * * * *

UNITED STATES PATENT AND TRADEMARK OFFICE
CERTIFICATE OF CORRECTION

PATENT NO. : 11,404,953 B2
APPLICATION NO. : 17/290996
DATED : August 2, 2022
INVENTOR(S) : Takeshi Horiguchi It is certified that error appears in the above-identified patent and that said Letters Patent is hereby corrected as shown below:

In the Claims

Column 23, Line 16, "Mate" should be --state--.

Column 24, Line 15, "detector" should be --detector to--.

Column 24, Line 22, "error" should be --unusual--.

Signed and Sealed this
Twenty-seventh Day of December, 2022

Katherine Kelly Vidal
*Director of the United States Patent and Trademark Office*